United States Patent
Ishizuya et al.

(10) Patent No.: US 12,557,508 B2
(45) Date of Patent: *Feb. 17, 2026

(54) LIGHT-EMITTING DEVICE, DISPLAY DEVICE, IMAGING DEVICE, ELECTRONIC DEVICE, AND METHOD FOR PRODUCING LIGHT-EMITTING DEVICE

(71) Applicant: CANON KABUSHIKI KAISHA, Tokyo (JP)

(72) Inventors: Koji Ishizuya, Kanagawa (JP); Hiroaki Sano, Kanagawa (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 18/626,593

(22) Filed: Apr. 4, 2024

(65) Prior Publication Data

US 2024/0251590 A1 Jul. 25, 2024

Related U.S. Application Data

(63) Continuation of application No. 17/506,952, filed on Oct. 21, 2021, now Pat. No. 11,980,053.

(30) Foreign Application Priority Data

Oct. 28, 2020 (JP) .................. 2020-180655

(51) Int. Cl.
*H10K 50/856* (2023.01)
*H10K 50/844* (2023.01)
(Continued)

(52) U.S. Cl.
CPC ........... *H10K 59/35* (2023.02); *H10K 59/876* (2023.02); *H10K 59/878* (2023.02);
(Continued)

(58) Field of Classification Search
CPC ........... H10K 59/8051–80518; H10K 59/878; H10K 59/8791; H10K 59/8792;
(Continued)

(56) References Cited

U.S. PATENT DOCUMENTS 8,237,360 B2 8/2012 Kinoshita
8,513,882 B2 8/2013 Kinoshita
(Continued)

FOREIGN PATENT DOCUMENTS

CN 107329278 A * 11/2017 ............. G02B 30/27
JP 2010-56017 A 3/2010
(Continued)

OTHER PUBLICATIONS

Espacenet, Machine translation, Lan, Chinese Pat. Pub. No. CN107329278A, translation date: Nov. 27, 2025, all pages. (Year: 2025).*

(Continued)

*Primary Examiner* — Victoria K. Hall
(74) *Attorney, Agent, or Firm* — Venable LLP

(57) ABSTRACT

The light-emitting device has: a display region; a peripheral region; a first light-emitting element having a light-emitting region in which a lower electrode, a light-emitting layer, and an upper electrode are laminated; a first laminated section, between the substrate and the lower electrode of the first light-emitting element, in which there are laminated a first high-reflection layer and a first low-reflection layer that has a lower reflectance than the first high-reflection layer; a peripheral laminated section, in the peripheral region, in which there are laminated on the substrate; a peripheral lamination layer in which a peripheral high-reflection layer and a peripheral low-reflection layer that has a lower reflectance than the peripheral high-reflection layer are laminated. For at least a portion of the first laminated section that (Continued)

overlaps in plan view with the light-emitting region, the first low-reflection layer has an opening such that the first high-reflection layer is exposed.

19 Claims, 11 Drawing Sheets

(51) Int. Cl.
*H10K 50/852* (2023.01)
*H10K 50/858* (2023.01)
*H10K 50/86* (2023.01)
*H10K 59/35* (2023.01)
*H10K 59/38* (2023.01)
*H10K 59/80* (2023.01)
*H10K 59/88* (2023.01)
*H10K 71/00* (2023.01)
*H10K 102/00* (2023.01)

(52) U.S. Cl.
CPC ......... *H10K 59/8792* (2023.02); *H10K 59/38* (2023.02); *H10K 59/873* (2023.02); *H10K 59/879* (2023.02); *H10K 59/88* (2023.02); *H10K 2102/3026* (2023.02); *H10K 2102/351* (2023.02)

(58) Field of Classification Search
CPC ......... H10K 50/81–818; H10K 50/856; H10K 50/86; H10K 50/865
See application file for complete search history.

(56) References Cited

U.S. PATENT DOCUMENTS

| | | |
|---|---|---|
| 9,978,822 B2 | 5/2018 | Ota |
| 10,134,646 B2 | 11/2018 | Byun et al. |
| 10,334,692 B2 | 6/2019 | Kikuchi |
| 10,368,418 B2 | 7/2019 | Kikuchi |
| 10,892,440 B2 | 1/2021 | Nishimura et al. |
| 10,930,891 B2 | 2/2021 | Sano et al. |
| 11,256,144 B2 | 2/2022 | Nishimura et al. |
| 11,284,483 B2 | 3/2022 | Kikuchi |
| 11,550,189 B2 | 1/2023 | Nishimura et al. |
| 11,765,925 B2 | 9/2023 | Nishimura et al. |
| 11,968,754 B2 | 4/2024 | Kikuchi |
| 11,980,053 B2 * | 5/2024 | Ishizuya ................. H10K 59/35 |
| 2010/0253222 A1 * | 10/2010 | Koshihara ............ H10K 50/852 445/35 |
| 2013/0056714 A1 | 3/2013 | Hasegawa et al. |
| 2015/0228930 A1 | 8/2015 | Murata |
| 2017/0229528 A1 * | 8/2017 | Ota ......................... H10K 59/35 |
| 2020/0271983 A1 | 8/2020 | Lee et al. |
| 2021/0013245 A1 * | 1/2021 | Tanaka ................. H10D 86/451 |
| 2023/0397451 A1 | 12/2023 | Nishimura et al. |

FOREIGN PATENT DOCUMENTS

| | | |
|---|---|---|
| JP | 2010-244693 A | 10/2010 |
| JP | 2013-54863 A | 3/2013 |
| JP | 2015-149258 A | 8/2015 |
| JP | 2017-142926 A | 8/2017 |
| JP | 2018-37390 A | 3/2018 |
| JP | 2018-88381 A | 6/2018 |
| JP | 2019-12098 A | 1/2019 |
| JP | 2020-155339 A | 9/2020 |
| WO | 2014/148263 A1 | 9/2014 |

OTHER PUBLICATIONS

European Patent Office, Decision to grant a European patent pursuant to Article 97(1) EPC, dated Nov. 20, 2025, all pages. (Year: 2025).*
Extended European Search Report in European Application No. 21204912.6 (Apr. 2022).
Request for the Submission of an Opinion in Korean Application No. 10-2021-0143153 (Jul. 2024).
Notice of Reasons for Refusal in Japanese Application No. 2020-180655 (Jul. 2024).
First Office Action in Chinese Application No. 202111246939.2 (Oct. 2025).

* cited by examiner

LIGHT-EMITTING DEVICE, DISPLAY DEVICE, IMAGING DEVICE, ELECTRONIC DEVICE, AND METHOD FOR PRODUCING LIGHT-EMITTING DEVICE

This application is a continuation application of U.S. patent Application Ser. No. 17/506,952, filed Oct. 21, 2021, now U.S. Pat. No. 11,980,053, which claims the benefit of Japanese Patent Application No. 2020-180655, filed Oct. 28, 2020. Both prior applications are hereby incorporated by reference herein in their entirety.

BACKGROUND OF THE INVENTION

Field of the Invention

The present invention relates to light-emitting devices, display devices, imaging devices, electronic devices, and a method for producing light-emitting devices.

Description of the Related Art

Organic EL elements are light-emitting elements that have a pair of electrodes and, located therebetween, an organic compound layer that contains a light-emitting layer. Organic EL elements exhibit excellent characteristics, i.e., surface emission behavior, light weight, and visibility, and due to this their practical utilization as light-emitting devices, e.g., thin displays, lighting fixtures, head-mounted displays, and light sources for the print heads of electrophotographic printers, is moving forward.

The demand to achieve higher definition organic EL display devices is increasing in particular. A method using a white organic EL element and color filters (the white+CF method) is known as one technology for providing higher definition. In the white+CF method, a plurality of color filters having different wavelength dependences for absorbed light are provided in the emission direction of the white light emitted by an organic EL element. For example, full-color display by additive mixing is made possible by forming individual color filters so the emitted colors after traversing the color filters are red, green, and blue. In the white+CF method, it is not necessary to form an organic compound layer as a function of the light-emitting pixel unit and thus achieving higher definition for the light-emitting pixels is facilitated.

Optimizing the optical distance between the light-emitting layer and a reflection film in the organic EL element is known for the purpose of improving the power consumption and chromaticity of organic EL display devices. Japanese Patent Application Laid-open No. 2017-142926 (PTL 1) discloses art for making the optical distance between the lower electrode and the reflection film different for each pixel having a different emission color in a white+CF method organic EL display device.

On the other hand, reducing external light reflection is known to improve the display quality of display devices. Japanese Patent Application Laid-open No. 2013-054863 (PTL 2) discloses art for reducing the external light reflection of electrodes disposed outside the display region.

PTL 1 makes no statements with regard to reductions in display quality due to external light reflection. Since the light-emitting device of PTL 1 is provided with an aluminum alloy over the entire region on the light output side of the reflection layer provided in the display region and outside the display region, it is thought that external light reflection in the display region and outside the display region will be large. When the external light reflection is large, reflected glare, coloration, and scattering occur and the display quality deteriorates.

SUMMARY OF THE INVENTION

In view of the above circumstances, an object of the present invention is to provide a light emitting device capable of exhibiting both a suppression of external light reflection and a high luminous efficacy.

The first aspect of the disclosure is a light-emitting device, having, on a substrate, a display region provided with at least a first light-emitting element, and a peripheral region residing on the periphery of the display region, wherein the first light-emitting element has a light-emitting region in which a lower electrode, a light-emitting layer, and an upper electrode are laminated in the indicated sequence from the side of the substrate; having, between the substrate and the lower electrode of the first light-emitting element, a first laminated section in which there are laminated, in the indicated sequence from the side of the substrate, a first high-reflection layer and a first low-reflection layer that has a lower reflectance than the first high-reflection layer; and having, in the peripheral region, a peripheral laminated section in which there are laminated on the substrate, in the indicated sequence from the side of the substrate, a peripheral high-reflection layer and a peripheral low-reflection layer that has a lower reflectance than the peripheral high-reflection layer; wherein for at least a portion of the first laminated section that overlaps in plan view with the light-emitting region, the first low-reflection layer has an opening such that the first high-reflection layer is exposed.

The second aspect of the disclosure is a light-emitting device, having, on a substrate, a display region provided with at least a first light-emitting element, and a peripheral region residing on the periphery of the display region, wherein the first light-emitting element has a light-emitting region in which a lower electrode, a light-emitting layer, and an upper electrode are laminated in the indicated sequence from the side of the substrate; having, between the substrate and the lower electrode of the first light-emitting element, a first laminated section in which there are laminated, in the indicated sequence from the side of the substrate, a first high-reflection layer and a first low-reflection layer; and having, in the peripheral region, a peripheral laminated section in which there are laminated on the substrate, in the indicated sequence from the side of the substrate, a peripheral high-reflection layer and a peripheral low-reflection layer that has a lower reflectance than the peripheral high-reflection layer; wherein the first high-reflection layer and the peripheral high-reflection layer are composed of material having Al or Ag; wherein the first low-reflection layer and the peripheral low-reflection layer are composed of material that has any of Co, Mo, Pt, Ta, Ti, TiN, and W; and wherein for at least a portion of the first laminated section that overlaps in plan view with the light-emitting region, the first low-reflection layer has an opening such that the first high-reflection layer is exposed.

The third aspect of the disclosure is a method for producing a light-emitting device that has a display region provided with a light-emitting element, and a peripheral region residing on the periphery of the display region, the method for producing a light-emitting device comprising a step of laminating, in the indicated sequence on a substrate, a high-reflection layer composed of a first material and a low-reflection layer composed of a second material that has a reflectance lower than that of the first material; a step of removing at least a portion of the low-reflection layer in the display region to provide an opening region in which the high-reflection layer is exposed; and a step of forming, above the opening region, a light-emitting element comprising a lower electrode, a light-emitting layer, and an upper electrode in the indicated sequence.

The fourth aspect of the disclosure is a method for producing a light-emitting device that has a display region provided with a light-emitting element, and a peripheral region residing on the periphery of the display region, the method for producing a light-emitting device comprising a step of laminating, in the indicated sequence on a substrate, a high-reflection layer composed of material having Al or Ag, and a low-reflection layer composed of material having any of Co, Mo, Pt, Ta, Ti, TiN, or W; a step of removing at least a portion of the low-reflection layer in the display region to provide an opening region in which the high-reflection layer is exposed; and a step of forming, above the opening region, a light-emitting element comprising a lower electrode, a light-emitting layer, and an upper electrode in the indicated sequence.

Further features of the present invention will become apparent from the following description of exemplary embodiments (with reference to the attached drawings).

DESCRIPTION OF THE EMBODIMENTS

Embodiments of the present invention are described in the following with reference to the appended drawings. However, the constituent elements described for these embodiments are simply examples, and the technical scope of the present invention is governed by the claims and should not be understood as being limited by the individual embodiments that follow.

In addition, the present invention is not limited to or by the following embodiments, and various modifications (including organic combinations of the individual embodiments) can be made based on the essential features disclosed in this Specification and are not excluded from the scope of the description in this Specification. Thus, configurations provided by combining the individual examples given below and their modification examples are all included in the embodiments described in this Specification.

First Embodiment

Figure 1:
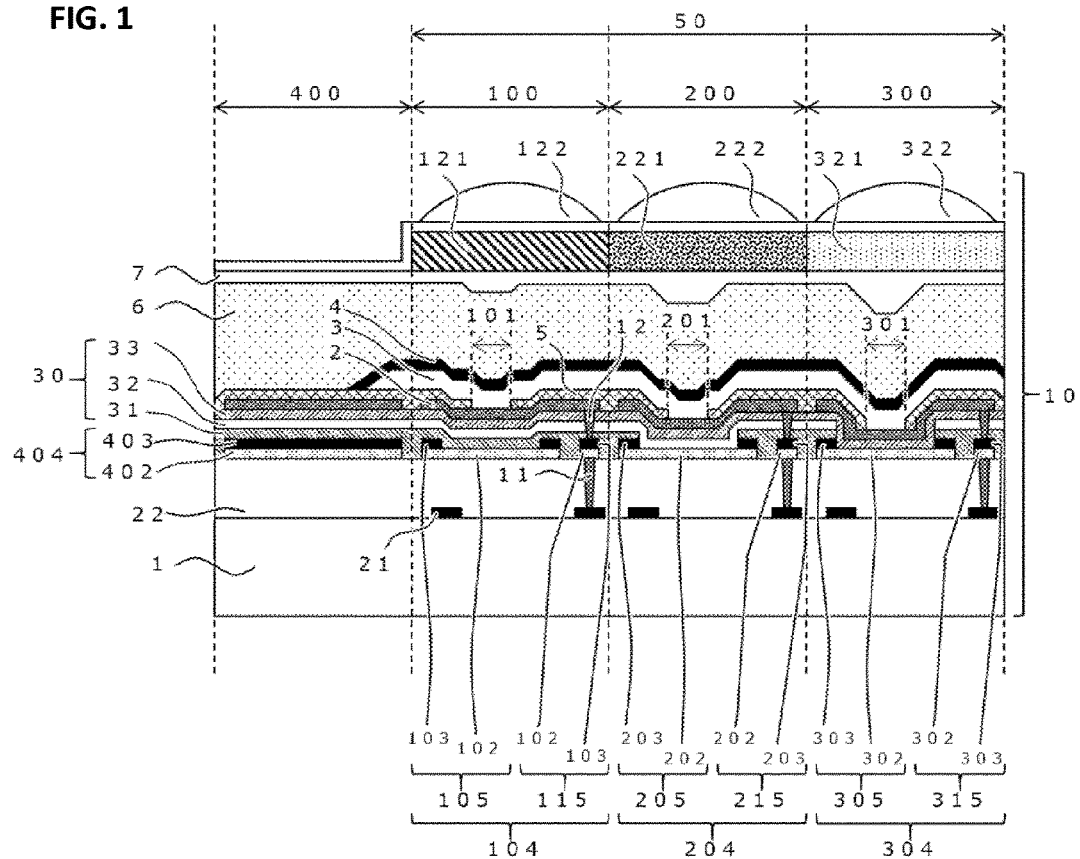
FIG. 1 is a schematic diagram of a cross section of an example of a light-emitting device according to a first embodiment.
Figure 2:
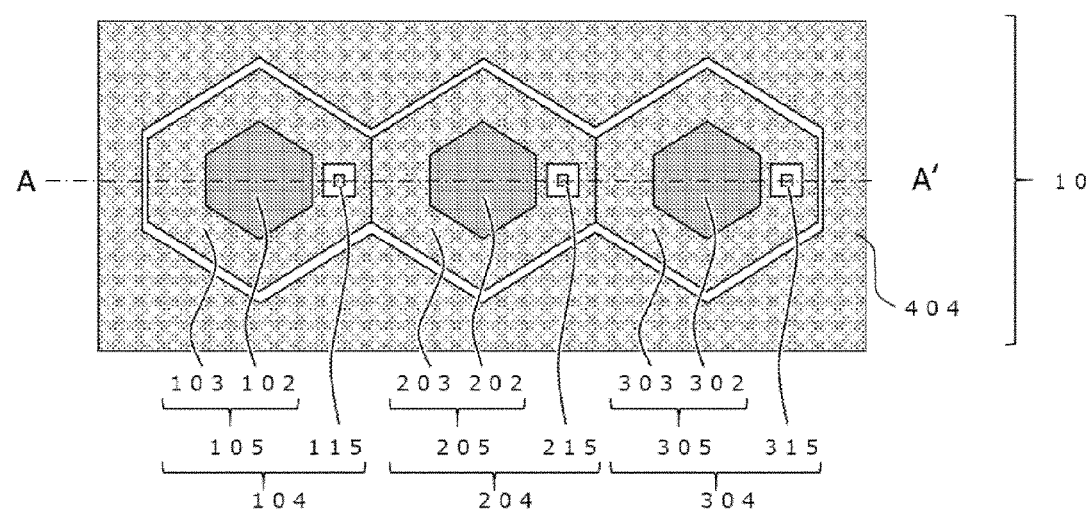
FIG. 2 is a schematic diagram of a plan of an example of a light-emitting device according to the first embodiment.

The structure of an organic EL device 10 will be described as a first embodiment of a light-emitting device according to the present invention. FIG. 1 is a schematic diagram of a cross section of the first embodiment. FIG. 2 is a schematic plan diagram of the first embodiment and shows the positional relationship in plan view of a first laminated section 104 in a display region 50 and a peripheral laminated section 404 in a peripheral region 400. FIG. 1 is a cross section along the A-A' line segment in FIG. 2. This embodiment uses, as the light-emitting element, an organic EL light-emitting element that contains an organic light-emitting material in the light-emitting layer, but it may be constituted of a light-emitting device that uses an inorganic EL light-emitting element that contains an inorganic light-emitting material in the light-emitting layer.

In the description that follows, the upward direction refers to the direction of the light-emitting layer with respect to the substrate, and the downward direction refers to the opposite direction. In the present embodiment, the light output direction is the upward direction. In addition, when a second layer is said to be disposed above a first layer, this includes both of the following: the case in which the first layer is in contact with the second layer, and the case in which a single third layer or a plurality of third layers are present interposed between the first layer and the second layer.

Overall Structure

The organic EL device 10 has a display region 50 that carries out display, and has a peripheral region 400 that does not carry out display and is a region that resides around the perimeter of the display region 50. A first organic EL element 100, a second organic EL element 200, and a third organic EL element 300 are provided in the display region 50 in FIG. 1, but there is no particular limitation on the number of organic EL elements with which the organic EL device 10 is provided. Since each of these organic EL elements has substantially the same structure, the following description will use the first organic EL element 100 as a representative.

The organic EL device 10 has a substrate 1, laminated sections 104, 204, 304, 404, an optical interference layer 30, a lower electrode 2, an organic compound layer 3, an upper electrode 4, a protection layer 6, color filters 121, 221, 321, and microlenses 122, 222, 322. The entire structure shown in FIG. 1 is not required for the execution of an organic EL device according to the present invention and a portion of this structure may be omitted.

The first organic EL element (first light-emitting element) 100 in the display region 50 has a light-emitting region in which the following are laminated in the indicated sequence from the substrate side: a lower electrode, a light-emitting layer, and an upper electrode. More particularly, the first organic EL element 100 contains a lower electrode 2, an upper electrode 4, and, sandwiched between the lower electrode 2 and the upper electrode 4, an organic compound layer 3 that contains at least a light-emitting layer. A first laminated section 104 is disposed between the lower electrode 2 and the substrate 1 of the first organic EL element 100. This is the same for the second organic EL element 200 and the third organic EL element 300. On the other hand, a peripheral laminated section 404 is disposed in the peripheral region 400. The organic EL device 10 is described in detail in the following.

Substrate 1

The substrate 1 is formed of a material that is capable of supporting the lower electrode 2, the organic compound layer 3, and the upper electrode 4. For example, glasses, plastics, silicon, and so forth are suitable for the material of the substrate 1. For example, a switching device (not shown) such as a transistor, and/or wiring 21, and/or an interlayer insulating film 22, and so forth may be formed on the substrate 1.

Lower Electrode 2

From the standpoint of the luminous efficacy, the lower electrode 2 preferably is a thin film of a material that exhibits light permeability. Specifically, the material of the lower electrode 2 is suitably a transparent conductive oxide, e.g., ITO or IZO, or is a metal such as Al, Ag, or Pt or an alloy thereof. Each of the lower electrodes 2 for the first organic EL element 100, second organic EL element 200, and third organic EL element 300 is electrically isolated. In order to optimize optical interference, the film thickness of the lower electrode 2 may be different for each of the first organic EL element 100, second organic EL element 200, and third organic EL element 300.

Organic Compound Layer 3

The organic compound layer 3 is disposed above the lower electrode 2 in the first organic EL element 100 and can be formed by a known art, e.g., vapor deposition, spin coating, and so forth. The organic compound layer 3 is a layer that contains at least a light-emitting layer and may be composed of a plurality of layers. The plurality of layers can be exemplified by a hole injection layer, hole transport layer, electron blocking layer, light-emitting layer, hole blocking layer, electron transport layer, and electron injection layer. Light is output from the light-emitting layer in the organic compound layer 3 due to the recombination in the light-emitting layer of holes injected from the anode and electrons injected from the cathode. The light-emitting layer may have a single-layer structure or a multilayer structure. A red light-emitting material, green light-emitting material, and blue light-emitting material may be present in any of individual light-emitting layers and white light can be obtained by mixing the individual emitted colors. In addition, light-emitting materials residing in a complementary relationship with each other, e.g., a blue light-emitting material and a yellow light-emitting material, may be provided in any of individual light-emitting layers.

The organic compound layer 3 may be disposed residing on the lower electrode 2 of the first organic EL element 100, the lower electrode 2 of the second organic EL element 200, and the lower electrode 2 of the third organic EL element 300. In addition, all or a portion of the organic compound layer 3 of the first organic EL element 100, the second organic EL element 200, and the third organic EL element 300 may be patterned in each element. The organic compound layer 3 may also be formed in the peripheral region 400 that resides on the periphery of the display region 50.

Upper Electrode 4

The upper electrode 4 is permeable to light and is disposed above the organic compound layer 3 of the first organic EL element. In addition, the upper electrode 4 may be a semi-transmissive material that has the ability to transmit a portion of the light that reaches its surface while reflecting another portion (i.e., a semi-transmissive reflective behavior). The material comprising the upper electrode 4 is composed of, for example, a transparent conductive oxide such as ITO or IZO or a semi-transmissive material composed of a metal material. Examples of the metal material are pure metals such as aluminum, silver, and gold; alkali metals such as lithium and cesium; alkaline-earth metals such as magnesium, calcium, and barium; and alloy materials that contain these metal materials. In particular, an alloy in which the main component is magnesium or silver is preferred for the semi-transmissive material. The upper electrode 4 may be a laminated structure of the preceding materials as long as a preferred transmittance is exhibited.

The upper electrode 4 may be disposed residing on the organic compound layer 3 of the first organic EL element 100, the organic compound layer 3 of the second organic EL element 200, and the organic compound layer 3 of the third organic EL element 300. In addition, the upper electrode 4 may be formed in the peripheral region 400 that resides on the periphery of the display region 50.

In the present embodiment, the lower electrode 2 may be the anode and the upper electrode 4 may be the cathode, or the lower electrode 2 may be the cathode and the upper electrode 4 may be the anode.

Insulating Layer 5

An insulating layer 5 may be disposed in the organic EL device 10 according to the present embodiment on the periphery of the lower electrode 2 of the first organic EL element 100. The insulating layer 5 is disposed on a portion of the lower electrode 2 and the lower electrode 2 is exposed in the region where the insulating layer 5 is not provided. The region where the lower electrode 2 is exposed provides a light-emitting region where the organic compound layer 3 emits light. The insulating layer 5 is formed in order to bring a first light-emitting region 101 precisely into a desired shape. When the insulating layer 5 is not provided, the first light-emitting region 101 is determined by the shape of the lower electrode 2. The insulating layer 5 is formed of an inorganic material, e.g., silicon nitride (SiN), silicon oxynitride (SiON), or silicon oxide (SiO). The insulating layer 5 can be formed using a known art, e.g., a sputtering method, a chemical vapor deposition method (CVD method), and so forth. The insulating layer 5 may also be formed using an organic material such as an acrylic resin or a polyimide resin.

Optical Interference Layer 30

The organic EL device 10 according to the present embodiment has an optical interference layer 30 between the first laminated section 104 and the lower electrode 2 of the first organic EL element 100. Adjustment of the thickness of the optical interference layer 30 enables optimization of the optical distance between the light-emitting layer of the first organic EL element 100 and a first high-reflection layer 102, and as a consequence improvement in the luminous efficacy utilizing optical interference is made possible. FIG. 1 illustrates an example in which the optical interference layer 30 of the first organic EL element 100 has a trilayer structure composed of a first optical interference layer 31, a second optical interference layer 32, and a third optical interference layer 33; however, there is no particular limitation on the number of layers and a monolayer structure may be used.

The second organic EL element 200 and/or the third organic EL element 300 may also have an optical interference layer 30. The use of different thicknesses for the respective optical interference layers in the first organic EL element 100, the second organic EL element 200, and the third organic EL element 300 makes it possible to adjust the color of the light that is emitted from each organic EL element. The use for the optical interference layer 30 of a laminated structure having a plurality of layers enables facile adjustment of the thickness of the optical interference layer 30 by changing the lamination count in correspondence to the element. For example, for the case in which the optical interference layer 30 is made thinner in the sequence first organic EL element 100>second organic EL element 200>third organic EL element 300, three layers, i.e., the first optical interference layer 31, the second optical interference layer 32, and the third optical interference layer 33, are disposed on the first laminated section 104. On the other hand, two layers, i.e., the second optical interference layer 32 and the third optical interference layer 33, are disposed on the second laminated section 204, while only the third optical interference layer 33 may be disposed on the third laminated section 304.

The optical interference layer 30 preferably is constituted of a transparent material and is particularly preferably constituted of SiO, SiN, or SiON. A known art, e.g., sputtering, CVD, ALD, and so forth, can be used for the method of formation.

An optical interference layer 30 may not be provided in some or all of the organic EL elements in the organic EL device 10. For example, the lower electrode 2 is in contact with the first laminated section 104 when an optical interference layer 30 is not provided in the first organic EL element 100.

Laminated Sections 104, 204, 304, and 404

The first organic EL element 100 in the present embodiment has a first laminated section 104 between the lower electrode 2 and the substrate 1. The first laminated section 104 contains a first pixel reflection region 105 and a first pixel contact region 115, which are insulated from each other. The first pixel reflection region 105 and the first pixel contact region 115 of the first laminated section 104 are each constructed by laminating a first high-reflection layer 102 and a first low-reflection layer 103 in the indicated sequence from the substrate side. Within the first pixel reflection region 105, the first low-reflection layer 103 of the first laminated section 104 has an opening—in at least a portion of the region that overlaps in plan view with the first light-emitting region 101—whereby the first high-reflection layer 102 is exposed. The optical interference layer 30 is in contact with the first high-reflection layer 102 in this opening region.

The first high-reflection layer 102 has a higher reflectance than the first low-reflection layer 103, and as a consequence light emitted by the first organic EL element passing through the lower electrode 2 can be reflected with good efficiency by the first high-reflection layer 102. The light reflected by the first high-reflection layer 102 exits from the upper electrode 4 to the light output side, and due to this the organic EL device according to the present embodiment can exhibit the property of a high luminous efficacy. Here, the light output side denotes the direction of the upper electrode 4 with respect to the lower electrode 2.

The second organic EL element 200 and the third organic EL element 300 similarly have a second laminated section 204 and a third laminated section 304, respectively. The second laminated section 204 contains a second pixel reflection region 205 and a second pixel contact region 215, which are insulated from each other, while the third laminated section 304 contains a third pixel reflection region 305 and a third pixel contact region 315, which are insulated from each other. The second laminated section 204 is constructed by laminating a second high-reflection layer 202 and a second low-reflection layer 203 in the indicated sequence from the side of the substrate 1, while the third laminated section 304 is constructed by laminating a third high-reflection layer 302 and a third low-reflection layer 303 in the indicated sequence from the side of the substrate 1. Within the second pixel reflection region 205, the second low-reflection layer 203 of the second laminated section 204 has an opening—in at least a portion of the region that overlaps in plan view with the second light-emitting region 201—whereby the second high-reflection layer 202 is exposed. Within the third pixel reflection region 305, the third low-reflection layer 303 of the third laminated section 304 has an opening—in at least a portion of the region that overlaps in plan view with the third light-emitting region 301—whereby the third high-reflection layer 302 is exposed. The optical interference layer 30 is in contact with the second high-reflection layer 202 or the third high-reflection layer 302 in the respective opening regions.

The peripheral region 400, on the other hand, has a peripheral laminated section 404. The peripheral laminated section 404 is constructed by laminating a peripheral high-reflection layer 402 and a peripheral low-reflection layer 403 in the indicated sequence from the side of the substrate 1. In the present embodiment, the peripheral low-reflection layer 403 does not have an opening whereby the peripheral high-reflection layer 402 is exposed. Accordingly, when external light impinges on the peripheral region 400 from the light output side, reflection of the external light is impeded since the peripheral low-reflection layer 403 resides on the light output side of the peripheral laminated section 404. Moreover, reflection of external light is impeded because the first low-reflection layer 103 is also present on the light output side of the first laminated section 104 in at least a portion of the region where the first laminated section 104 and the first light-emitting region 101 of the display region 50 do not overlap with one another. Accordingly, even when outside light from the ambient impinges on the organic EL device, those factors associated with the ambient light that reduce display quality, i.e., reflected glare, coloration, dazzle, and scattering, can be suppressed in the present embodiment.

With regard to the opening of the first low-reflection layer 103 of the first laminated section 104, which opening is disposed in the region of overlap with the first light-emitting region 101, the effects of the present embodiment are obtained when it is present in at least a portion of the region of overlap with the first light-emitting region 101. As long as the first laminated section 104 has a first low-reflection layer 103, the size of the opening is not particularly limited; however, from the standpoint of improving the luminous efficacy, it is particularly preferably at least as large as the first light-emitting region 101.

In addition, in the peripheral laminated section 404 of the peripheral region 400, the region where the peripheral low-reflection layer 403 is disposed on the light output side is preferably the entire region of the peripheral laminated section 404 from the standpoint of suppressing the reflection of external light; however, a location may be present where a portion of the peripheral low-reflection layer 403 is removed. Preferably a low-reflectance material or a light-absorptive material is formed on the light output side in the location where a portion of the peripheral low-reflection layer 403 is removed.

The first high-reflection layer 102 of the first laminated section 104 and the peripheral high-reflection layer 402 of the peripheral laminated section 404 are preferably constructed of material having the same main component. The first low-reflection layer 103 of the first laminated section 104 and the peripheral low-reflection layer 403 of the peripheral laminated section 404 are preferably constructed of material having the same main component. Here, the main component indicates the element present at the highest component ratio (element ratio). In addition, the first high-reflection layer 102 of the first laminated section 104 and the peripheral high-reflection layer 402 of the peripheral laminated section 404 preferably are composed of material having approximately the same reflectance. The first low-reflection layer 103 of the first laminated section 104 and the peripheral low-reflection layer 403 of the peripheral laminated section 404 preferably are composed of material having approximately the same reflectance. This "approximately the same reflectance" means that the difference in the reflectance is within 10 percentage points. It more preferably means that the difference in the reflectance is within 5 percentage points.

The laminated materials constituting the first laminated section 104 and the peripheral laminated section 404 should have a reflectance that satisfies the prescribed conditions, but are not otherwise particularly limited. Table 1 provides some typical examples of materials that may constitute the first laminated section 104 and the peripheral laminated section 404. The laminated materials in the individual laminated sections are preferably selected from the materials provided in Table 1 based on a consideration of the reflectance relationship. The difference in the reflectance between the first high-reflection layer 102 and the first low-reflection layer 103 is preferably at least 10 percentage points and is particularly preferably at least 30 percentage points. For example, the first high-reflection layer 102 and the peripheral high-reflection layer 402 are preferably composed of a material that contains Ag or Al and are more preferably composed of a material for which the main component is Ag or Al. In addition, the first low-reflection layer 103 and the peripheral low-reflection layer 403 are preferably composed of a material that has at least any of, e.g., Co, Mo, Pt, Ta, Ti, TiN, or W, and are more preferably composed of a material having any of these as its main component. Moreover, the first high-reflection layer 102 and the peripheral high-reflection layer 402, and the first low-reflection layer 103 and the peripheral low-reflection layer 403, may be an alloy or a compound.

TABLE 1

Reflectance at 550 nm of some typical materials

| | |
|---|---|
| Ag | 96% |
| Al | 92% |
| Co | 65% |
| Mo | 57% |
| Pt | 64% |
| Ta | 36% |
| Ti | 50% |
| TiN | 47% |
| W | 49% |

With regard to examples of material combinations, the first high-reflection layer 102 and the peripheral high-reflection layer 402 may be a material for which Al is the main component, and the first low-reflection layer 103 and the peripheral low-reflection layer 403 may be a material for which Ti or TiN is the main component. Moreover, the first high-reflection layer 102 and the peripheral high-reflection layer 402 preferably have Al as their main component and contain Cu. The first low-reflection layer 103 and the peripheral low-reflection layer 403 preferably have TiN as their main component. The first low-reflection layer 103 and the peripheral low-reflection layer 403 preferably have a thickness that will provide electrical conductivity and a reflection-suppressing effect. When the first low-reflection layer 103 and the peripheral low-reflection layer 403 have TiN as their main component, their thickness is preferably at least 1 nm and not more than 200 nm and is more preferably at least 5 nm and not more than 100 nm. In addition, a barrier metal, e.g., Ti or TiN, may be disposed on the substrate side of the first laminated section 104 and/or the peripheral laminated section 404.

The first high-reflection layer 102 and the peripheral high-reflection layer 402, and the first low-reflection layer 103 and the peripheral low-reflection layer 403, can be formed by known film-formation procedures, e.g., sputtering methods, CVD methods, ALD methods, and so forth. The first high-reflection layer 102 and the peripheral high-reflection layer 402 may be simultaneously formed of material having the same main component, by forming a film of a high-reflectance material on the substrate and subsequently patterning by a known etching process. In addition, the first low-reflection layer 103 and the peripheral low-reflection layer 403 may also be simultaneously formed of material having the same main component, by forming a film of a low-reflectance material on the substrate and subsequently patterning by a known etching process. Preferably the first laminated section 104 and the peripheral laminated section 404 may be formed simultaneously by forming a high-reflectance material on the substrate, then forming a low-reflectance material, and patterning by an etching process.

From the standpoint of suppressing process variance during film formation and during patterning by etching, the distance between the first laminated section 104 and the substrate 1 is preferably approximately the same as the distance between the peripheral laminated section 404 and the substrate 1. In addition, the film thickness of the first high-reflection layer 102 is preferably approximately the same as the film thickness of the peripheral high-reflection layer 402, and the film thickness of the first low-reflection layer 103 is preferably approximately the same as the film thickness of the peripheral low-reflection layer 403.

The opening region of the first low-reflection layer 103 that is provided in the first laminated section 104 may be formed by removal of the first low-reflection layer 103 by a known etching process. As long as the reflectance of the first high-reflection layer 102 in the opening region is the desired characteristic, a component of the first low-reflection layer 103 may be present in the first high-reflection layer 102 that is exposed in the opening region. For example, the TiN main component of the first low-reflection layer 103 may be contained, in contrast to the Al main component of the first high-reflection layer 102, in the first high-reflection layer 102 exposed in the opening region. With regard to the desired characteristic, for example, the reflectance of the first high-reflection layer 102 in the opening region is preferably at least 10 percentage points higher than the reflectance of the first low-reflection layer 103 and more preferably is at least 30 percentage points higher.

In the present embodiment, the first laminated section 104 and the peripheral laminated section 404 have a high-reflectance member on the substrate side with a low-reflectance member being disposed on the light output side, and due to this only the first low-reflection layer need be removed in the region of overlap with the light-emitting region where a high reflectance is required. Accordingly, the area of the first low-reflection layer 103 of the first laminated section 104 in the display region 50 may differ from the area in plan view of the peripheral low-reflection layer 403 of the peripheral laminated section 404 in the peripheral region 400.

In the present embodiment, at least a portion of the peripheral laminated section 404 and at least a portion of the upper electrode 4 may overlap in plan view in the peripheral region 400 and at least each of the portions may be separated from one another in cross-sectional view. A high reflectance for the upper electrode 4 is provided when the upper electrode 4 is semi-transmissive/semi-reflective and/or when there is a large difference in refractive index between the upper electrode 4 and the material on the light output side of the upper electrode 4. In such cases, optical interference is produced—for external light incident from around the organic EL device—by the optical distance between the peripheral laminated section 404 and the upper electrode 4. In the present embodiment, due to the low reflectance of the peripheral laminated section 404, coloration due to the optical interference produced by the peripheral laminated section 404 and the upper electrode 4 can be suppressed.

Furthermore, when the peripheral laminated section 404, the organic compound layer 3, and the upper electrode 4 all overlap in plan view, the thickness of the organic compound layer 3 or the light-emitting layer may vary in the plane direction for at least a portion that is between the peripheral low-reflection layer 403 and the upper electrode 4. When the thickness of the organic compound layer 3 between the peripheral laminated section 404 and the upper electrode 4 varies, the optical distance between the peripheral laminated section 404 and the upper electrode 4 then varies and the wavelength of the light that is reinforced by optical interference ends up varying. However, in the present embodiment, due to the low reflectance of the peripheral laminated section 404, the fluctuation in coloration produced at the peripheral laminated section 404, the organic compound layer 3, and the upper electrode 4 can be suppressed.

The lower electrode 2 may be electrically connected to the first laminated section 104 in the present embodiment. Current can flow from the first laminated section 104 to the first organic EL element 100 by forming the first laminated section 104 of a conductive material and electrically connecting the lower electrode 2 to the first laminated section 104. More particularly, by connecting the lower electrode 2 to the first high-reflection layer 102 via the first low-reflection layer 103 of the first laminated section 104, current can flow to the lower electrode 2 from the first high-reflection layer 102. In addition, when an optical interference layer 30 is provided, the lower electrode 2 of the first organic EL element 100 may be electrically connected to the first low-reflection layer 103 of the first laminated section 104 by providing a plug 12 that penetrates the optical interference layer 30 and forming conductive material within the plug. A known conductive material such as W, Ti, or TiN may be used for the conductive material provided in the plug. The conductive material provided in the plug may be the same material as the lower electrode 2. In other words, the lower electrode 2 may be brought into contact with the first laminated section 104 through the plug. The position of contact with the plug 12 in the first laminated section 104 preferably is the first low-reflection layer 103 from the standpoint of suppressing external light reflection.

Figure 3:
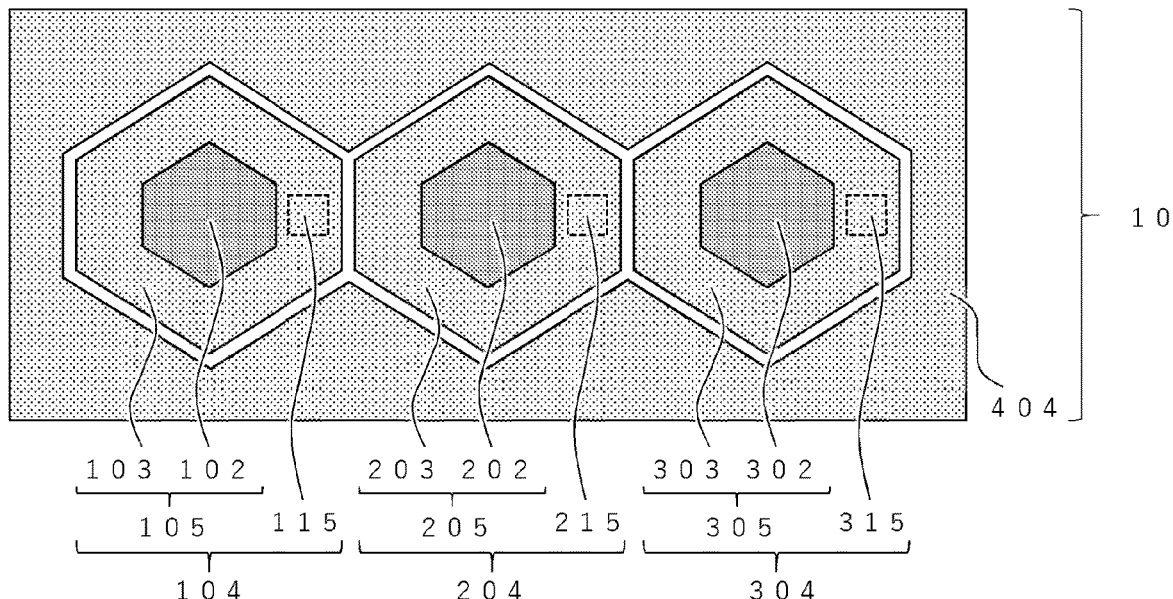
FIG. 3 is a schematic diagram of a plan of an example of a light-emitting device according to the first embodiment.

The region of plug disposition, for example, as shown in FIG. 2 and FIG. 3, is preferably the pixel contact region 115, where there is the first low-reflection layer of the first laminated section 104. When the first laminated section 104 and the lower electrode 2 are in direct contact, the first low-reflection layer 103 and the lower electrode 2 are particularly preferably a combination that suppresses galvanic corrosion. For example, preferably the first low-reflection layer 103 is formed of a material for which TiN is the main component and the lower electrode 2 is ITO or IZO.

In the structure shown in FIG. 2, the first laminated section 104 has a pixel contact region 115 which is isolated from the first pixel reflection region 105 and is electrically connected to the lower electrode 2. More specifically, the first high-reflection layer 102 of the first laminated section 104 in the pixel contact region 115 is connected to wiring that is connected to an external power source. In orthographic projection with respect to the substrate 1, the junction of the first high-reflection layer 102 with this wiring is disposed in a location that is not overlapped by the opening region of the first laminated section 104. In addition, in orthographic projection with respect to the substrate 1, the first high-reflection layer 102 that overlaps with the opening region (the first high-reflection layer 102 of the first pixel reflection region 105) is separated from the first high-reflection layer 102 at the junction with the wiring (the first high-reflection layer 102 in the pixel contact region 115). In the structure shown in FIG. 3, the first pixel reflection region 105 is electrically connected to the pixel contact region 115. In either case, current can flow into the lower electrode 2 through the pixel contact region 115 in the first organic EL element 100.

Figure 4:
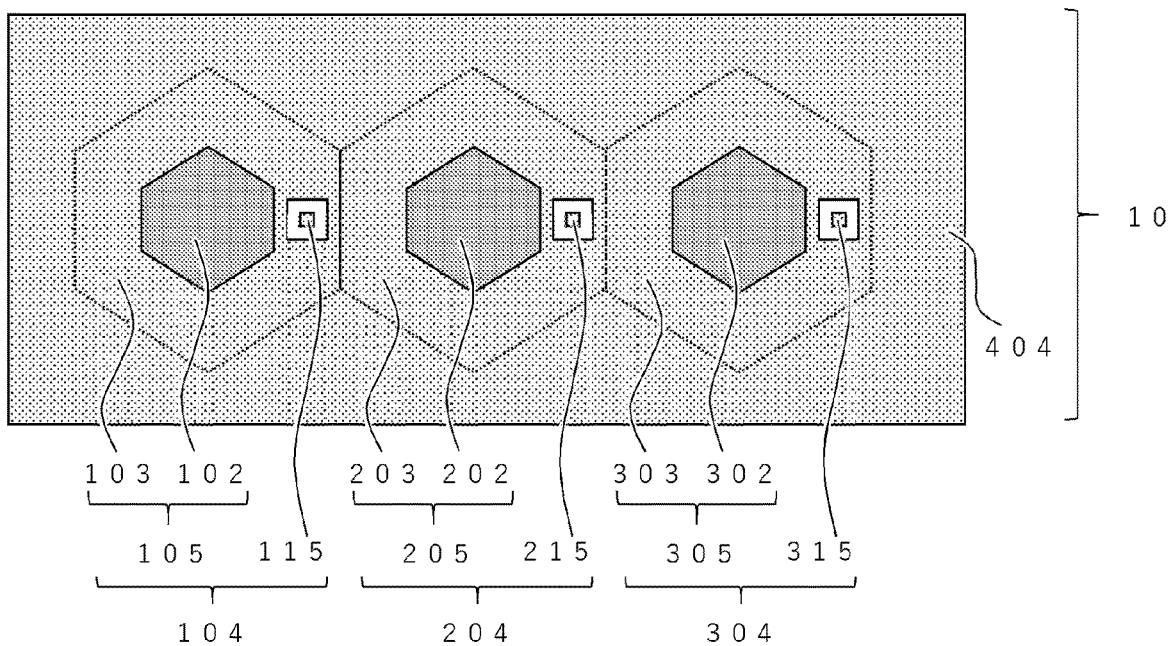
FIG. 4 is a schematic diagram of a plan of an example of a light-emitting device according to the first embodiment.

In addition, the second organic EL element 200 and the third organic EL element 300 may also have, respectively, the same pixel contact region 215 and pixel contact region 315. When the pixel reflection region and the pixel contact region are connected in the particular organic EL element, as shown in FIG. 3 the pixel reflection region of the particular organic EL element is isolated and electrically insulated. On the other hand, when the pixel reflection region is electrically insulated from the pixel contact region of the particular organic EL element, the pixel reflection regions on adjacent organic EL elements may contact each other and may be electrically connected, as shown in FIG. 2. In addition, as shown in FIG. 4, the peripheral laminated section 404 may be electrically connected by contact with the pixel reflection region in each of the first organic EL element 100, the second organic EL element 200, and the third organic EL element 300.

Any potential may be established for the pixel reflection region when the respective pixel reflection regions of the first organic EL element 100, the second organic EL element 200, and the third organic EL element 300 are electrically connected and the pixel reflection regions are insulated from the pixel contact regions. In particular, the potential difference between the pixel reflection region and the upper electrode 4 preferably is less than the emission threshold voltage of the organic EL element. When, due to manufacturing variability, a defect occurs whereby the pixel contact region of a certain element and the pixel reflection region are electrically connected, the potential of the pixel contact region will be the same as the potential of the pixel reflection region. Since the pixel contact region and the lower electrode are at the same potential, an organic EL element in which the pixel reflection region and lower electrode are electrically connected does not emit when the potential difference between the pixel reflection region and the upper electrode is established at less than the emission threshold voltage of the organic EL element. The possibility of large pixel defects can thus be reduced. In addition, the potential of the pixel reflection region preferably is the same as that of the upper electrode 4.

Protection Layer 6

A protection layer 6 may be formed so as to cover at least the first organic EL element 100 in the organic EL device 10 according to the present embodiment. The protection layer 6 preferably is light transmissive and contains an inorganic material that exhibits a very low permeability to oxygen and moisture from the outside. Inorganic materials such as silicon nitride (SiN), silicon oxynitride (SiON), silicon oxide ($SiO_x$), aluminum oxide ($Al_2O_3$), and titanium oxide ($TiO_2$) are particularly preferred. The inorganic materials SiN, SiON, and $Al_2O_3$ are particularly preferred from the standpoint of the sealing characteristics. The use of a chemical vapor deposition method (CVD method), atomic layer deposition method (ALD method), or sputtering method is preferred for forming the protection layer 6. As long as a satisfactory moisture barrier performance is present, the protection layer 6 may have a monolayer structure or may have a laminated structure provided by combining the aforementioned materials and/or formation methods. In addition, it may be a laminated structure of an inorganic material and an organic material such as a resin. In addition, when a second organic EL element 200 and a third organic EL element 300 are formed, a protection layer 6 may be placed over the upper electrode 4 of the first organic EL element, the upper electrode 4 of the second organic EL element, and the upper electrode 4 of the third organic EL element. The protection layer 6 may also be disposed extending to and including the peripheral region 400.

Planarized Layer 7

A planarized layer 7 may also be formed on the protection layer 6 of the first organic EL element 100. This planarized layer 7 is preferably formed by a wet process, e.g., spin coating, dip coating, slit coating, blade coating, and so forth. Planarization of the surface of the light output side of the planarized layer 7 is readily achieved by the execution of a wet process. After its formation, the planarized layer 7 formed by the wet process is preferably cured by, e.g., heat or UV irradiation. When a second organic EL element 200 and a third organic EL element 300 are formed, a planarized layer 7 may be disposed over the protection layer 6 for the first organic EL element, the protection layer 6 for the second organic EL element, and the protection layer 6 for the third organic EL element.

Color Filters 121, 221, and 321

A first color filter 121 may be disposed on the light output side of the planarized layer 7 of the first organic EL element 100. A second color filter 221 may also be disposed on the light output side of the planarized layer 7 of the second organic EL element 200, and a third color filter 321 also may be disposed on the light output side of the planarized layer 7 of the third organic EL element 300. The first color filter 121, the second color filter 221, and the third color filter 321 can cause changes in the wavelength component of the transmitted light. The first color filter 121, the second color filter 221, and the third color filter 321 can be formed by coating a color resist on a foundation, e.g., the planarized layer 7, and then patterning this by lithography. The color resist, for example, is composed of a photocurable resin with a pattern being formed by curing regions that are irradiated with, e.g., ultraviolet radiation.

Lenses 122, 222, and 322

A first lens 122 may be disposed on the light output side of the first color filter 121 of the first organic EL element 100. The first lens 122 may be disposed on the substrate side of the first color filter 121. The luminous efficacy of the first organic EL element 100 can be improved by the installation of the first lens 122. In addition, a second lens 222 may be disposed above or below the second color filter 221 of the second organic EL element 200, and a third lens 322 may be disposed above or below the third color filter 321 of the third organic EL element 300.

The first lens 122 exhibits light transmissivity and is composed, for example, of an organic material, e.g., acrylic resin, epoxy resin, or silicone resin, or an inorganic material, e.g., silicon nitride (SiN), silicon oxynitride (SiON), or silicon oxide (SiO).

The shape of the first lens 122 may be a protruding shape or a depressed shape. In the case of a protruding shape, a material having a refractive index lower than that of the material constituting the lens is formed on the light output side of the lens. In particular, a gas, e.g., air, nitrogen, and so forth, a low refractive index material, e.g., a silica aerogel, or a vacuum condition, is preferred. When a protrusion-shaped lens is composed of a high-refraction material such as SiN, the light output side of the lens may also be composed of a material having a relatively low refractive index, e.g., an organic material such as an acrylic resin, epoxy resin, or silicone resin, or an inorganic material such as silicon oxide (SiO). In the case of a lens having a depressed shape, a material having a refractive index higher than that the material constituting the lens is formed on the light output side. There are no particular limitations on the shape of the lens. It may be either a spherical surface or a nonspherical surface.

The material and shape of the second lens 222 and the third lens 322 may be the same as those of the first lens 122; however, a material or shape different from that of the first lens 122 may be used.

In the present embodiment, a plurality of organic EL elements, e.g., the first organic EL element 100, the second organic EL element 200, and the third organic EL element 300, can each be regarded as a subpixel and the plurality of organic EL elements can be regarded as one main pixel. The pixel arrangement of the subpixels may be any pixel arrangement, e.g., a stripe array, pentile array, delta array, Bayer array, and so forth. In particular, circular lenses are easily positioned within the display plane in the case of a delta array, which is thus preferred. In addition, a high-definition display device can be obtained by the disposition of a plurality of main pixels in the display plane.

Advantageous Effects of the Present Embodiment

In the present embodiment, a low-reflectance member is disposed on the light output side of the peripheral laminated section 404, and external light reflection can be suppressed as a result. In addition, a high luminous efficacy can be achieved due to the high-reflectance member that is exposed at the first laminated section 104 and due to a reinforcement of the irradiated light wavelength components by the optical interference layer 30.

In the present embodiment, in the first laminated section 104 and the peripheral laminated section 404 there are high-reflectance members on the substrate side and low-reflectance members are disposed on the light output side, and as a consequence only the first low-reflection layer of the region that overlaps with the light-emitting region, where a high reflectance is required, needs to be removed.

In order to suppress external light reflection, in PTL 2 the reflection film on the substrate side of the lower electrode 2 is composed of a low-reflectance member disposed on the substrate side and a high-reflectance member disposed on the light output side. In order to suppress external light reflection in such a structure, for example, the high-reflectance member on the light output side must be removed by an etching process technology. Generally, the region of removal of the high-reflectance member in the display region 50 and the region of removal of the high-reflectance member in the peripheral region frequently are different areas. For example, the removal of the entire high-reflectance member in the peripheral region is desirable, while in the display region it is desirable to leave the high-reflectance member in the central region and to remove the high-reflectance member in the marginal region. In particular, when the lower electrode 2 and the reflection film are connected using a plug 12, from the standpoint of preventing galvanic corrosion it is desirable to remove the high-reflectance member and connect the plug 12 to the low-reflectance member.

When the area of the high-reflectance member to be removed is different in the display region 50 and the peripheral region 400, the etching rate ends up being different and as a consequence a process for simultaneously removing the high-reflectance material in the display region 50 and the peripheral region is infeasible. In addition, while two steps, i.e., a process of removing the high-reflectance member in the display region 50 and a process of removing the high-reflectance member in the peripheral region, may be carried out separately, this ends up expanding the process. Moreover, when residues of the high-reflectance member are produced in the display region, there is a risk that galvanic corrosion will be produced and the resistance will be increased.

In contrast, in the present embodiment and as noted above, within the display region only the low-reflection layer of the region that overlaps with the light-emitting region, where a high reflectance is required, needs to be removed, and removal of the low-reflection layer in other regions is not required. Thus, the present embodiment makes it possible to produce, by a simple and convenient process, an organic EL device in which a suppression of external light reflection can coexist with a high luminous efficacy.

Second Embodiment

The structure of an organic EL device 20 that is provided with a plurality of organic EL devices is described as a second embodiment of the light-emitting device according to the present invention.

Figure 5:
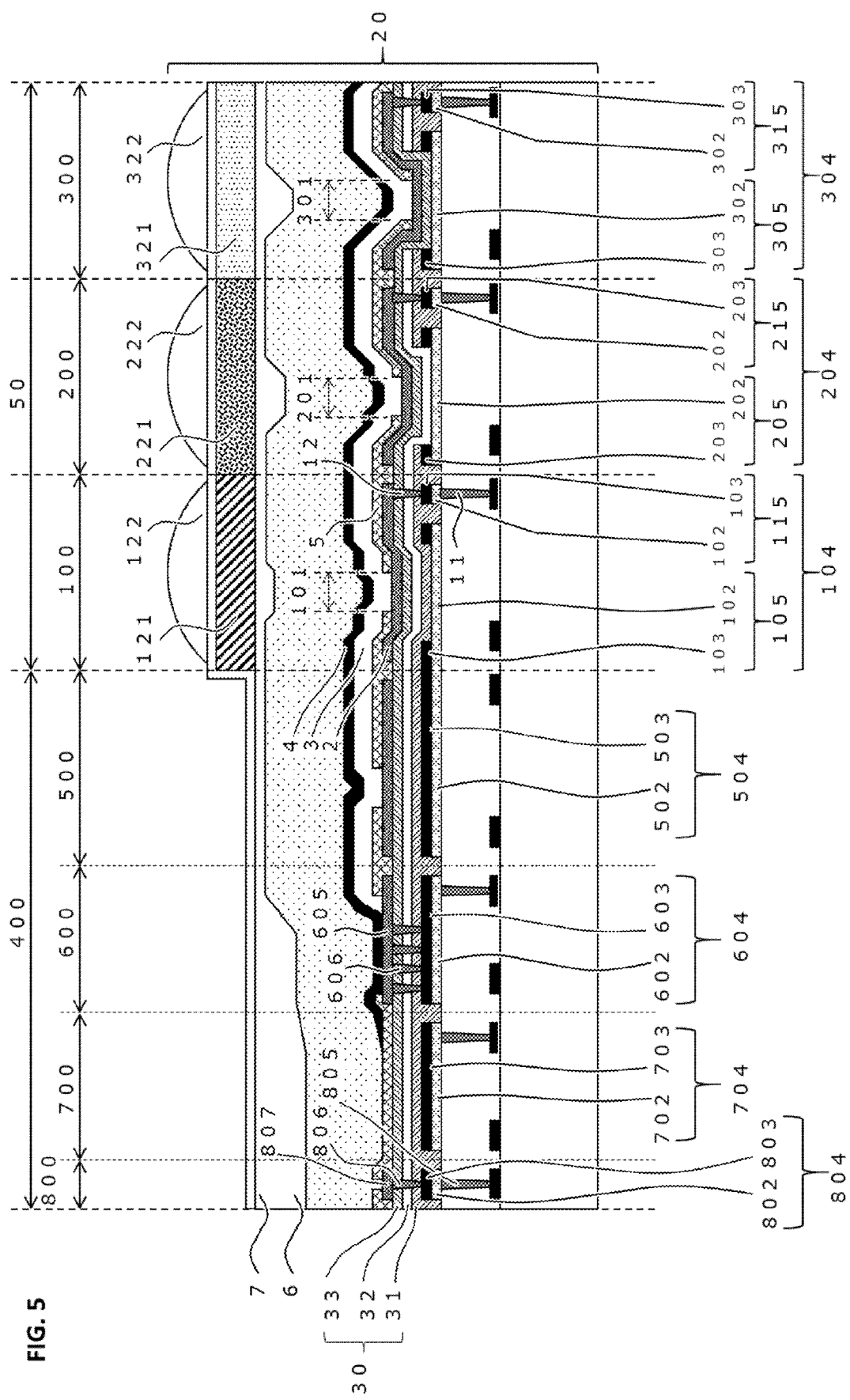
FIG. 5 is a schematic diagram of a cross section of an example of a light-emitting device according to a second embodiment.
Figure 6:
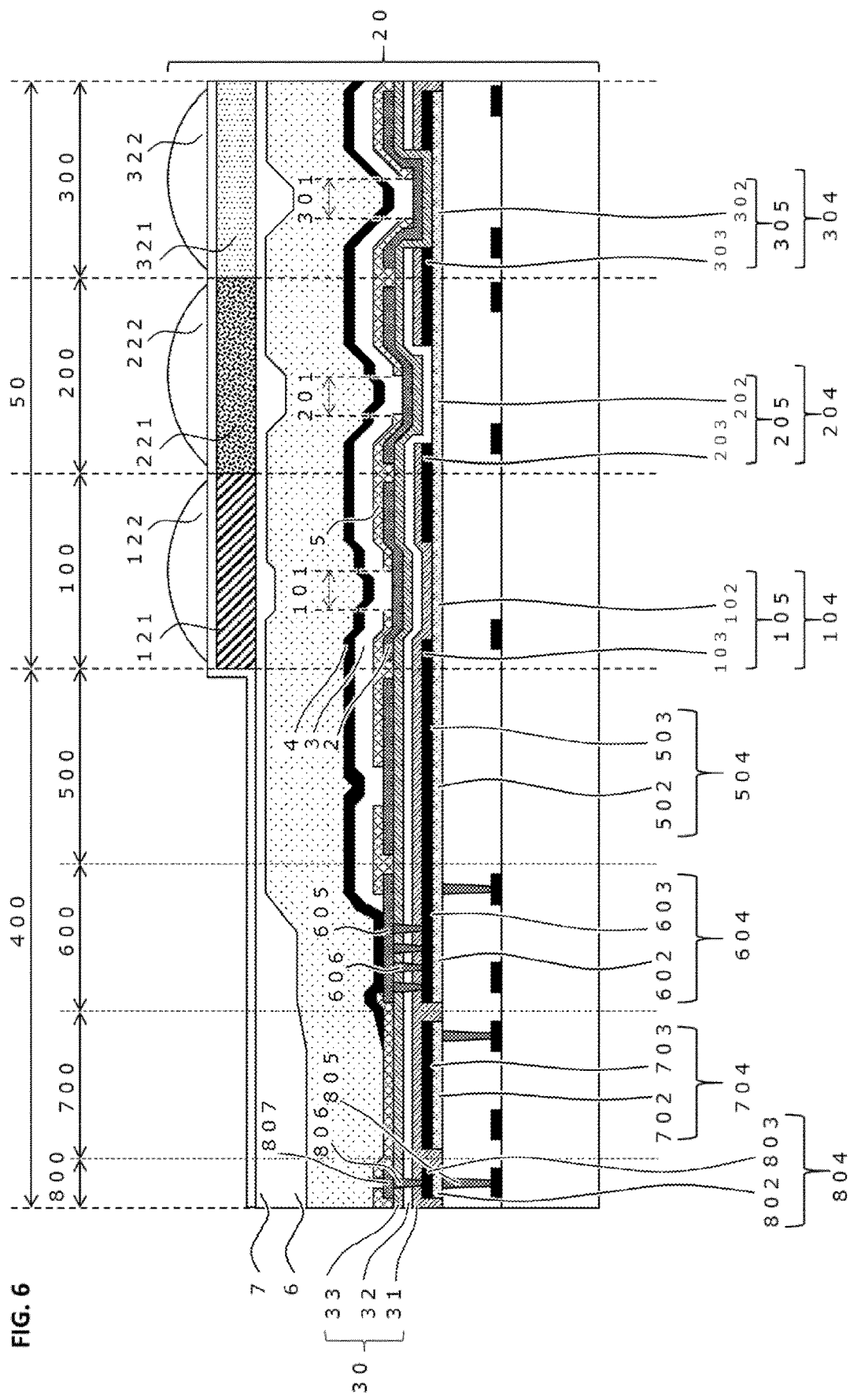
FIG. 6 is a schematic diagram of a cross section of an example of a light-emitting device according to the second embodiment.
Figure 7:
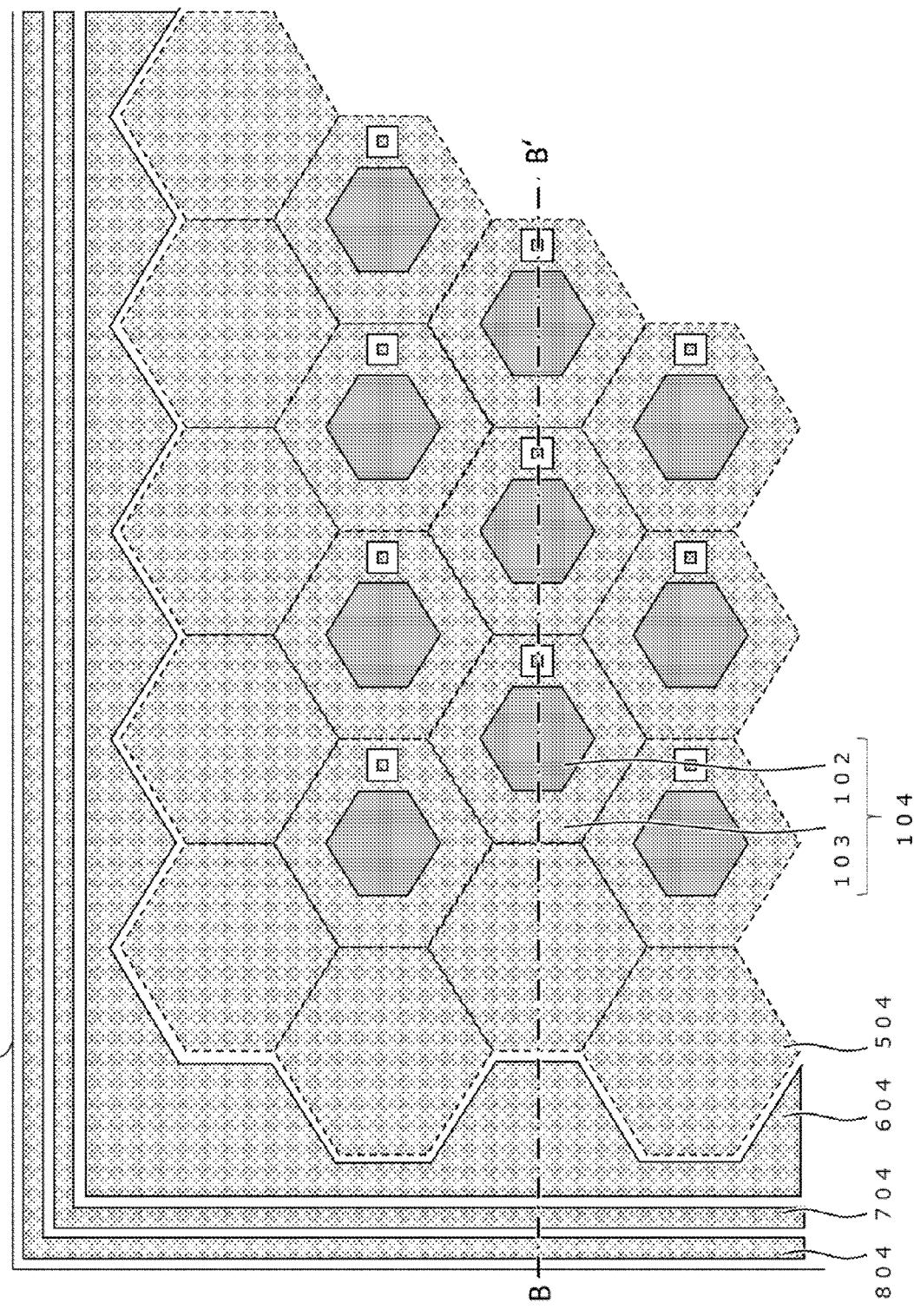
FIG. 7 is a schematic diagram of a plan of an example of a light-emitting device according to the second embodiment.
Figure 8:
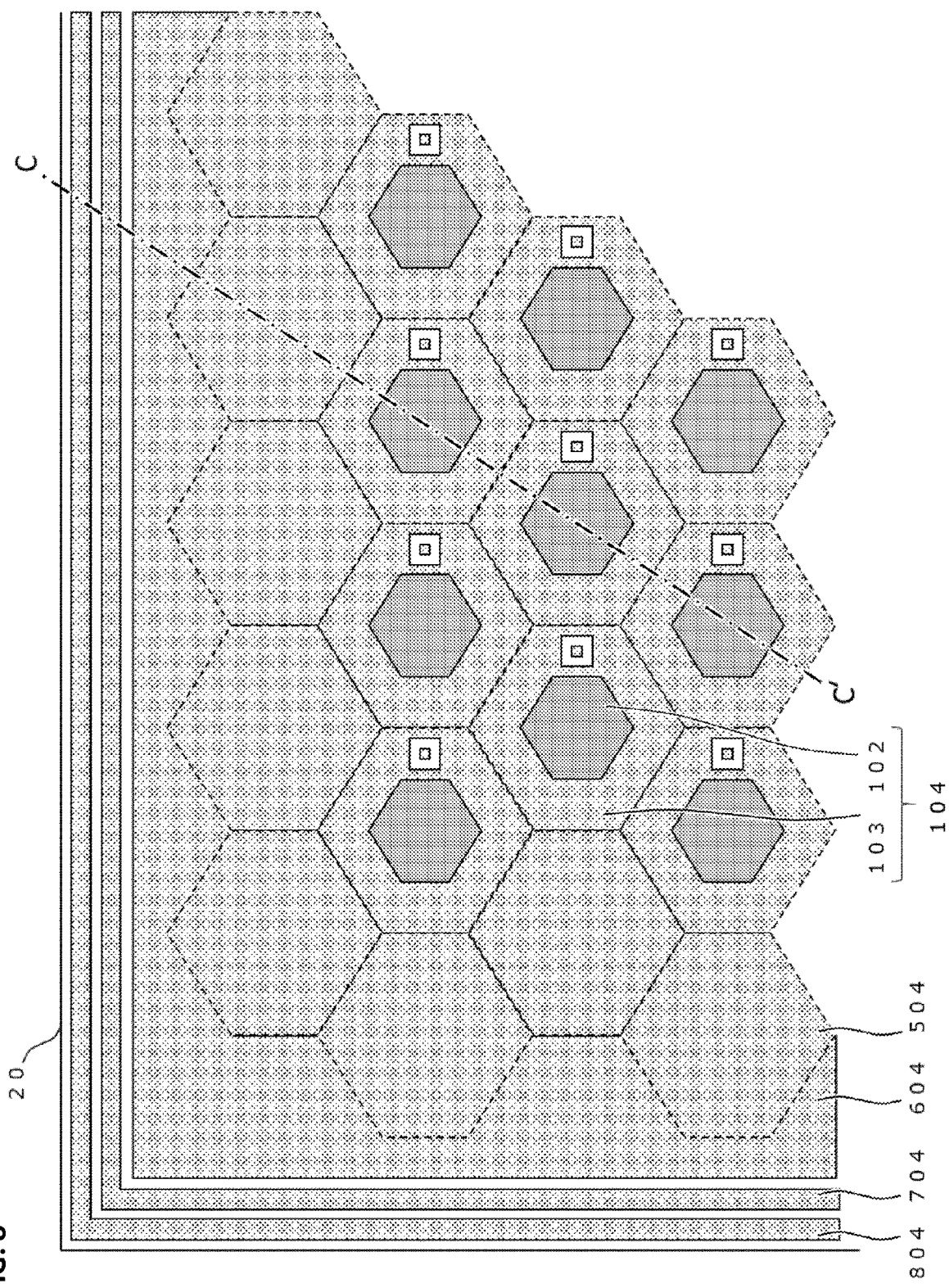
FIG. 8 is a schematic diagram of a plan of an example of a light-emitting device according to the second embodiment.

FIG. 5 and FIG. 6 are schematic diagrams of cross sections of the present embodiment. FIG. 7 and FIG. 8 show the relationships for the present embodiment in plan view for the first laminated section 104 of the display region 50 and the peripheral laminated section of the peripheral region 400. FIG. 5 is a schematic diagram of the cross section on the B-B' line segment in FIG. 7, and FIG. 6 is a schematic diagram of the cross section on the C-C' line segment in FIG. 8. In the present embodiment, the peripheral region 400 includes a dummy region 500, an upper electrode contact region 600, a wiring region 700, and a moisture proof region 800.

FIG. 5 and FIG. 7 are a structural example in which a laminated section 504 of the dummy region 500 is electrically insulated from a laminated section 604 of the upper electrode contact region 600. FIG. 6 and FIG. 8 are a structural example in which these laminated sections are electrically connected. The structure in FIG. 5 and FIG. 7 is the same as the structure in FIG. 6 and FIG. 8, excluding whether the laminated section 504 and laminated section 604 are connected. In addition, the structures according to the first embodiment can be used for those structures that are not particularly described in the present embodiment.

The first organic EL element 100, the second organic EL element 200, and the third organic EL element 300 in the display region 50 of the organic EL device 20 reside in a delta array. A dummy region 500, in which a dummy pixel is formed, is disposed on the perimeter of the display region 50. An upper electrode contact region 600 for supplying current to the upper electrode 4 is disposed on the perimeter of the dummy region 500. A wiring region 700 is disposed at the perimeter of the upper electrode contact region 600, and a moisture proof region 800 is disposed at the perimeter of the former.

Dummy Region 500

In FIG. 5, the dummy region 500 is disposed within the peripheral region 400, which resides on the periphery of the display region 50. In the dummy region 500, a peripheral high-reflection layer 502 is disposed to the substrate side of the peripheral laminated section 504, and a peripheral low-reflection layer 503 is disposed to the light output side (the side opposite from the substrate 1) of the peripheral laminated section 504. The peripheral high-reflection layer 502 has the same main component as the first high-reflection layer 102 of the first laminated section 104, and the peripheral low-reflection layer 503 has the same main component as the first low-reflection layer 103 of the first laminated section 104.

The dummy region 500 is a region within the peripheral region 400, and is provided with a structure that is the same as the structure of at least a portion of the first organic EL element 100 of the display region 50. The production variability within the display region 50 can be suppressed by the formation of the dummy region 500. For example, as shown in FIG. 5 and FIG. 6, a lower electrode 2, an insulating layer 5, an organic compound layer 3, and an upper electrode 4 may be formed in the dummy region 500 just as in the display region 50.

External light reflection by the peripheral region 400 can be suppressed in the present embodiment due to the provision of the peripheral low-reflection layer 503 on the light output side of the peripheral laminated section 504 in the dummy region 500.

The peripheral laminated section 504 of the dummy region 500 may be insulated from the first laminated section 104. In addition, when the pixel contact region 115 of the first organic EL element 100 is insulated from the pixel reflection region 105, the peripheral laminated section 504 of the dummy region 500 and the pixel reflection region 105 of the display region 50 may be electrically connected, as shown in FIG. 5 and FIG. 7. This also applies to the pixel reflection region 205 of the second organic EL element 200 and the pixel reflection region 305 of the third organic EL element 300.

In addition, in the peripheral laminated section 504 of the dummy region 500, the peripheral low-reflection layer 503 may be partially removed, but a light-absorptive material is preferably formed on the light output side of the peripheral laminated section 504. The light-absorptive material may be the first color filter 121, the second color filter 221, or the third color filter 321.

The first laminated section 104 and the peripheral laminated section 504 can be formed simultaneously by forming a film of a high-reflectance material on the substrate, then forming a film of a low-reflectance material, and patterning by an etching process. From the standpoint of suppressing process variance during film formation and during patterning by etching, the distance between the first laminated section 104 and the substrate 1 is preferably approximately the same as the distance between the peripheral laminated section 504 and the substrate 1. In addition, the film thickness of the first high-reflection layer 102 is preferably approximately the same as the film thickness of the peripheral high-reflection layer 502, and the film thickness of the first low-reflection layer 103 is preferably approximately the same as the film thickness of the peripheral low-reflection layer 503.

Upper Electrode Contact Region 600

In FIG. 5, an upper electrode contact region 600 is disposed within the peripheral region 400, which resides on the periphery of the display region 50. In the upper electrode contact region 600, a peripheral high-reflection layer 602 is disposed to the substrate side of the peripheral laminated section 604, and a peripheral low-reflection layer 603 is disposed to the light output side of the peripheral laminated section 604. The peripheral high-reflection layer 602 has the same main component as the first high-reflection layer 102 of the first laminated section 104, and the peripheral low-reflection layer 603 has the same main component as the first low-reflection layer 103 of the first laminated section 104.

The upper electrode contact region 600 is a region that has an electrode that is electrically connected to the upper electrode 4, and is a region that can supply current to the upper electrode 4. The upper electrode 4 and the peripheral laminated section 604 may be directly connected, or there may be, between the upper electrode 4 and the peripheral laminated section 604, a member that acts as an intermediary in the electrical connection therebetween. For example, as shown in FIG. 5 and FIG. 6, the upper electrode 4 may be electrically connected to the peripheral laminated section 604 through the formation of a plug 606 and an intermediate electrode 605 on the peripheral laminated section 604 of the upper electrode contact region 600. The intermediate electrode 605 can be composed of material having the same main component as the lower electrode 2. In addition, the plug 606 may be filled by the intermediate electrode 605 or, for example, may be filled by another material such as W, TiN, or Ti. As shown in FIG. 5 and FIG. 7, the peripheral laminated section 604 may be electrically insulated from the first laminated section 104.

External light reflection by the peripheral region 400 can be suppressed in the present embodiment due to the provision of the peripheral low-reflection layer 603 on the light output side of the peripheral laminated section 604 in the upper electrode contact region 600.

In addition, when the pixel contact region of the first organic EL element 100 is insulated from the pixel reflection region, the peripheral laminated section 604 of the upper electrode contact region 600 and the pixel reflection region 105 of the display region 50 may be electrically connected. The same also applies to the pixel reflection region 205 of the second organic EL element 200 and the pixel reflection region 305 of the third organic EL element 300. In such a case, the potentials of the upper electrode 4 and the pixel reflection regions 105, 205, 305 become the same. When, due to manufacturing variability, a defect occurs whereby the pixel contact region of a certain element and the pixel reflection region are electrically connected, the potential of the pixel contact region is made the same as the potential of the upper electrode 4 when the peripheral laminated section 604 of the upper electrode contact region 600 and the pixel reflection region are connected. Because the upper electrode 4 and the lower electrode 2 assume the same potential, an organic EL element in which the pixel reflection region and the lower electrode are electrically connected does not emit light and the appearance of large pixel defects can therefore be prevented.

Moreover, when the pixel contact region of each organic EL element is insulated from the pixel reflection region as above, as shown in FIG. 6 and FIG. 8 the peripheral laminated section 604, the peripheral laminated section 504, and the pixel reflection region of the display region 50 may be electrically connected. In such a case, the potentials of the upper electrode 4, the peripheral laminated section 604, the peripheral laminated section 504, and the pixel reflection region become the same and large pixel defects can be prevented as above.

The first laminated section 104 and the peripheral laminated section 604 can be formed simultaneously by forming a film of a high-reflectance material on the substrate, then forming a film of a low-reflectance material, and patterning by an etching process. From the standpoint of suppressing process variance during film formation and during patterning by etching, the distance between the first laminated section 104 and the substrate 1 is preferably approximately the same as the distance between the peripheral laminated section 604 and the substrate 1. In addition, the film thickness of the first high-reflection layer 102 is preferably approximately the same as the film thickness of the peripheral high-reflection layer 602, and the film thickness of the first low-reflection layer 103 is preferably approximately the same as the film thickness of the peripheral low-reflection layer 603.

Wiring Region 700

In FIG. 5, the wiring region 700 is disposed within the peripheral region 400, which resides on the periphery of the display region 50. In the wiring region 700, a peripheral high-reflection layer 702 is disposed to the substrate side of the peripheral laminated section 704, and a peripheral low-reflection layer 703 is disposed to the light output side of the peripheral laminated section 704. The peripheral high-reflection layer 702 has the same main component as the first high-reflection layer 102 of the first laminated section 104, and the peripheral low-reflection layer 703 has the same main component as the first low-reflection layer of the first laminated section 104.

The wiring region 700 is a region in which the peripheral laminated section 704, which is electrically insulated from the upper electrode 4, is disposed as wiring. The use of the wiring is not particularly limited.

External light reflection by the wiring region 700 can be suppressed in the present embodiment due to the provision of the peripheral low-reflection layer 703 on the light output side of the peripheral laminated section 704 in the wiring region 700.

The first laminated section 104 and the peripheral laminated section 704 can be formed simultaneously by forming a film of a high-reflectance material on the substrate, then forming a film of a low-reflectance material, and patterning by an etching process. From the standpoint of suppressing process variance during film formation and during patterning by etching, the distance between the first laminated section 104 and the substrate 1 is preferably approximately the same as the distance between the peripheral laminated section 704 and the substrate 1. In addition, the film thickness of the first high-reflection layer 102 is preferably approximately the same as the film thickness of the peripheral high-reflection layer 702, and the film thickness of the first low-reflection layer 103 is preferably approximately the same as the film thickness of the peripheral low-reflection layer 703.

Moisture Proof Region 800

In FIG. 5, the moisture proof region 800 is disposed within the peripheral region 400, which resides on the periphery of the display region 50. In the moisture proof region 800, a peripheral high-reflection layer 802 is disposed to the substrate side of the peripheral laminated section 804, and a peripheral low-reflection layer 803 is disposed to the light output side of the peripheral laminated section 804. The peripheral high-reflection layer 802 has the same main component as the first high-reflection layer 102 of the first laminated section 104, and the peripheral low-reflection layer 803 has the same main component as the first low-reflection layer of the first laminated section 104.

The moisture proof region 800 is disposed at the outermost periphery of the organic EL device and is formed for the purpose of preventing the infiltration of moisture from the ambient for the organic EL device. Thus, from the standpoint of blocking moisture, the peripheral laminated section 804 is preferably formed continuously on the outermost periphery of the organic EL device 10. In the moisture proof region 800, a plug 805 is disposed to the substrate side of the peripheral laminated section 804 and a plug 806 is disposed to the light output side of the peripheral laminated section 804. From the standpoint of blocking moisture, the plug 805 and the plug 806 are also preferably formed continuously on the outermost periphery of the organic EL device. In addition, a contact section 807, which is provided above the plug 806, is preferably also formed continuously on the outermost periphery of the organic EL device from the standpoint of blocking moisture. Particularly when a protection layer 6 is provided, the protection layer 6 and the contact section 807 are more preferably in direct contact. The contact section 807 can be formed of material that has the same main component as the lower electrode 2.

External light reflection by the moisture proof region 800 can be suppressed in the present embodiment due to the provision of the peripheral low-reflection layer 803 on the light output side of the peripheral laminated section 804 in the moisture proof region 800.

The first laminated section 104 and the peripheral laminated section 804 can be formed simultaneously by forming a film of a high-reflectance material on the substrate, then forming a film of a low-reflectance material, and patterning by an etching process. From the standpoint of suppressing process variance during film formation and during patterning by etching, the distance between the first laminated section 104 and the substrate 1 is preferably approximately the same as the distance between the peripheral laminated section 804 and the substrate 1. In addition, the film thickness of the first high-reflection layer 102 is preferably approximately the same as the film thickness of the peripheral high-reflection layer 802, and the film thickness of the first low-reflection layer 103 is preferably approximately the same as the film thickness of the peripheral low-reflection layer 803.

Third Embodiment

A third embodiment of the present invention will be described. In this embodiment, examples are described of the application to various devices of the light-emitting device 10 according to the first and second embodiments.

Figure 9:
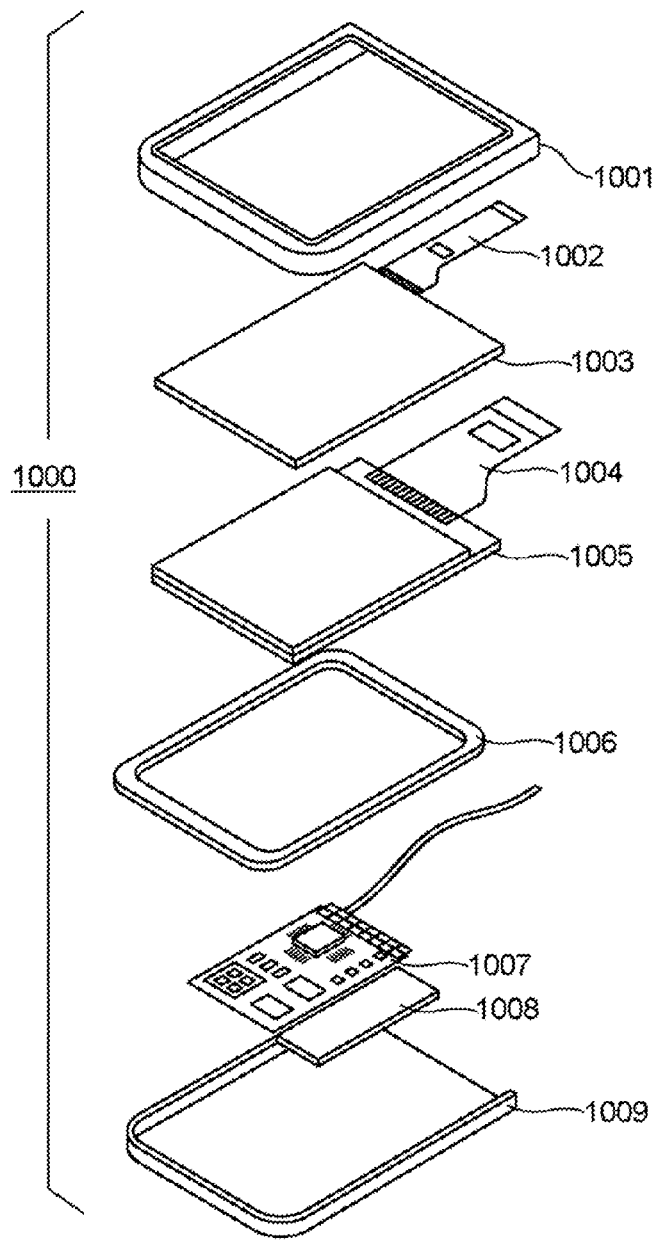
FIG. 9 is a schematic diagram that shows a display device according to a third embodiment.

FIG. 9 is a schematic diagram that shows a display device 1000 that is an example of a display device according to the present embodiment. The display device 1000 may have, between an upper cover 1001 and a lower cover 1009, a touch panel 1003, a display panel 1005, a frame 1006, a circuit board 1007, and a battery 1008. The display panel 1005 is a display section that has a light-emitting device 10 according to the first or second embodiment, and that carries out display using light produced from the light-emitting device 10. A flexible printed circuit FPC 1002, 1004 is connected to the touch panel 1003 and the display panel 1005, respectively. A transistor-containing control circuit is printed on the circuit board 1007 and performs various types of control, e.g., control of the display panel 1005. The battery 1008 need not be provided when the display device is not a portable device, and may be provided at another location even when the display device is a portable device. The display device 1000 may have three types of color filters corresponding, respectively, to red, green, and blue. A plurality of color filters may be arranged in a delta array.

The display device 1000 may be used in the display section of a portable terminal. In this case the display device 1000 may have both a display function and an operating function. The portable terminal can be exemplified by mobile phones, e.g., smart phones, and by tablets, head-mounted displays, and so forth.

The display device 1000 may be used in the display section of an imaging device that is provided with an optical section having a plurality of lens and with an imaging element that receives light that has passed through the optical section. The imaging device may have a display section that displays information acquired by the imaging element (for example, an image captured by the imaging element). In addition, the display section may be a display section exposed to the outside of the imaging device or may be a display section located within a finder. The imaging device may be, for example, a digital camera, digital video camera, and so forth.

Figure 10A:
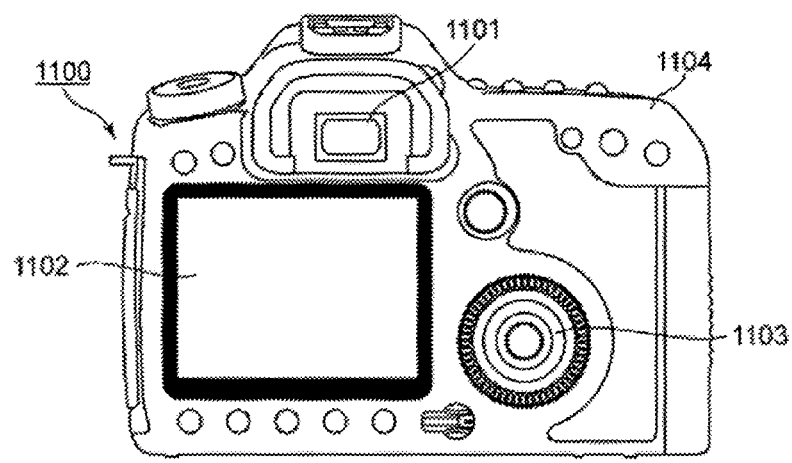
FIG. 10A and FIG. 10B are schematic diagrams that show an imaging device and an electronic device according to the third embodiment.

FIG. 10A is a schematic diagram that depicts an imaging device 1100 that is an example of an imaging device according to the present embodiment. The imaging device 1100 may have a view finder 1101, a backside display 1102, an operating element 1103, and a casing 1104. The view finder 1101 may have a display device according to the present embodiment (a display device that has a light-emitting device 10 according to the first or second embodiment and that performs display using light emitted from the light-emitting device 10). In this case the display device may display not only the captured image, but also environmental information, capture instructions, and so forth. The environmental information may be, for example, the intensity of the exterior light, the direction of the exterior light, the speed of subject motion, the possibility that the subject is shielded by a cover, and so forth. The backside display 1102 may also have a display device according to the present embodiment.

Information display should be carried out as rapidly as possible since preferably little time is taken up by imaging. The use is therefore preferred of a display device that uses organic light-emitting elements that have a rapid response rate. For devices where the display rate is critical, a display device that uses organic light-emitting elements can be more suitably used than, for example, a liquid-crystal display device.

The imaging device 1100 has an optical section (not shown). The optical section has a plurality of lenses and provides a light image to the imaging element housed in the casing 1104. The plurality of lenses can adjust the focus through adjustment of their relative positions. This operation can also be performed automatically. The imaging device 1100 may be thought of as a photoelectric conversion device. The imaging method for the photoelectric conversion device can include methods in which differences from a previous image are detected, methods in which a part of a recorded image is cut out, and so forth, rather than sequential imaging.

Figure 10B:
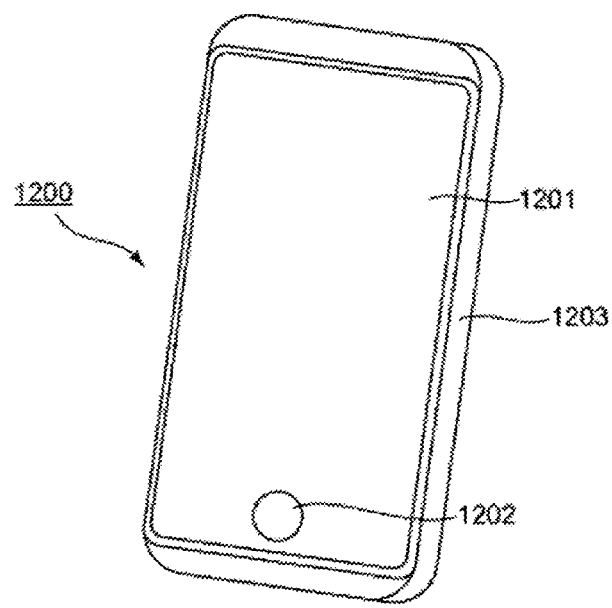

FIG. 10B is a schematic view showing an electronic device 1200 that is an example of an electronic device according to the present embodiment. The electronic device 1200 has a display section 1201, an operating feature 1202, and a housing 1203. The display section 1201 has a light-emitting device 10 according to the first or second embodiment, and carries out display using light emitted from the light-emitting device 10. The electronic device 1200 may have, in the housing 1203, a circuit, a printed board bearing the circuit, a battery, and a communication section for communicating with the outside. The operating feature 1202 may be a button or a touch panel-type reactive feature. The operating feature may be a biometric recognition feature that performs, for example, fingerprint recognition and lock release. An electronic device having a communication section may also be thought of as a communication device. The electronic device may also have a camera function through the disposition of a lens and an imaging element. The image captured by the camera function is displayed on the display section. Smart phones and notebook computers are examples of the electronic device.

Figure 11A:
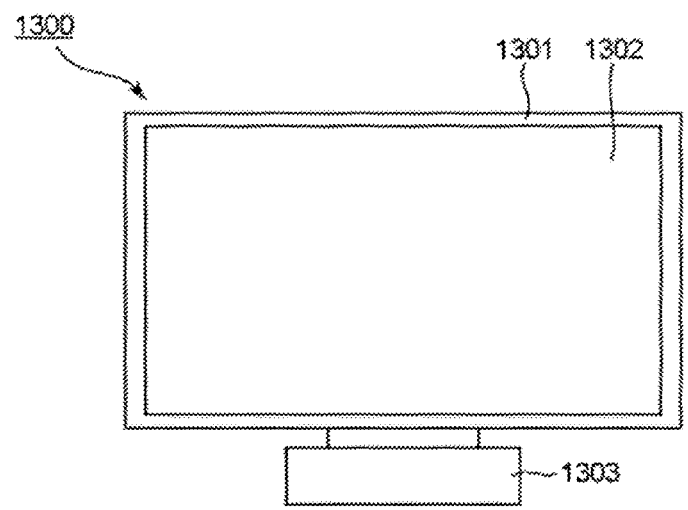
FIG. 11A and FIG. 11B are schematic diagrams that show a display device according to the third embodiment.

FIG. 11A is a schematic diagram that depicts a display device 1300 that is an example of a display device according to the present embodiment. The display device 1300 is a display device such as a TV monitor or a PC monitor. The display device 1300 has a frame 1301, a display section 1302, and a base 1303 that supports the frame 1301 and the display section 1302. The display section 1302 has a light-emitting device 10 according to the first or second embodiment, and carries out display using light emitted from the light-emitting device 10. The shape of the base 1303 is not limited to the shape in FIG. 11A. The lower edge of the frame 1301 may also function as the base 1303. In addition, the frame 1301 and the display section 1302 may be curved. Their radius of curvature may be at least 5,000 mm and not more than 6,000 mm.

Figure 11B:
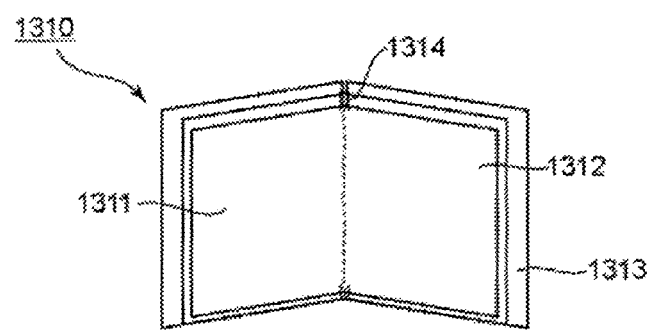

FIG. 11B is a schematic diagram that depicts a display device 1310 that is an example of another display device according to the present embodiment. The display device 1310 is constructed to be foldable, i.e., is a so-called foldable display device. The display device 1310 has a first display section 1311, a second display section 1312, a housing 1313, and a bending point 1314. Both the first display section 1311 and the second display section 1312 have a light-emitting device 10 according to the first or second embodiment, and carry out display using light emitted from the light-emitting device 10. The first display section 1311 and the second display section 1312 may be a single seamless display device. The first display section 1311 and the second display section 1312 can be separated by a bending point. The first display section 1311 and the second display section 1312 may display images that are different from each other, or the first display section 1311 and the second display section 1312 may display a single image.

Figure 12A:
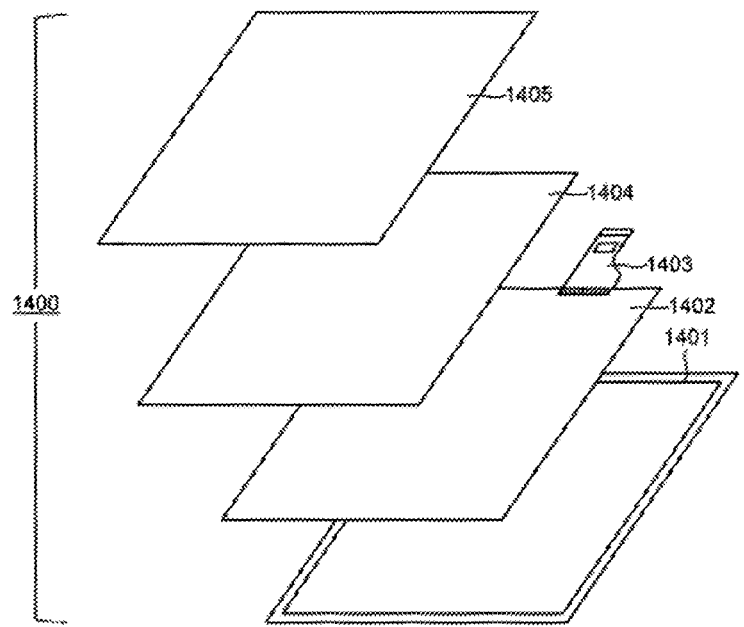
FIG. 12A and FIG. 12B are schematic diagrams that show a lighting device and a mobile object according to the third embodiment.

FIG. 12A is a schematic diagram that depicts a lighting device 1400 that is an example of a lighting device according to the present embodiment. The lighting device 1400 may have a housing 1401, a light source 1402, a circuit board 1403, an optical film 1404, and a light diffuser 1405. The light source 1402 has a light-emitting device 10 according to the first or second embodiment. The optical film 1404 may be a filter (optical filter) that improves color rendering by the light source 1402. The light diffuser 1405 can effectively diffuse the light from the light source 1402 and deliver the light over a wide range, e.g., broad area illumination. The optical film 1404 and the light diffuser 1405 may be provided on the light output side of the lighting device 1400. A cover may be provided on the outermost side on an optional basis.

The lighting device 1400, for example, is a device that lights the interior of a room. The lighting device 1400 may emit white, daylight white, or another color (any color from blue to red). White is a color having a color temperature of 4200 K, and daylight white is a color having a color temperature of 5000 K. The lighting device 1400 may have a dimming circuit for adjusting the emission color of the lighting device 1400. The lighting device 1400 may have a power supply circuit connected to the light source 1402. The power supply circuit is a circuit that converts an AC voltage into DC voltage. The lighting device 1400 may have a color filter. In addition, the lighting device 1400 may have a heat radiating element. The heat radiating element emits the heat inside the device to outside the device, and examples thereof are high specific heat metals and liquid silicone.

Figure 12B:
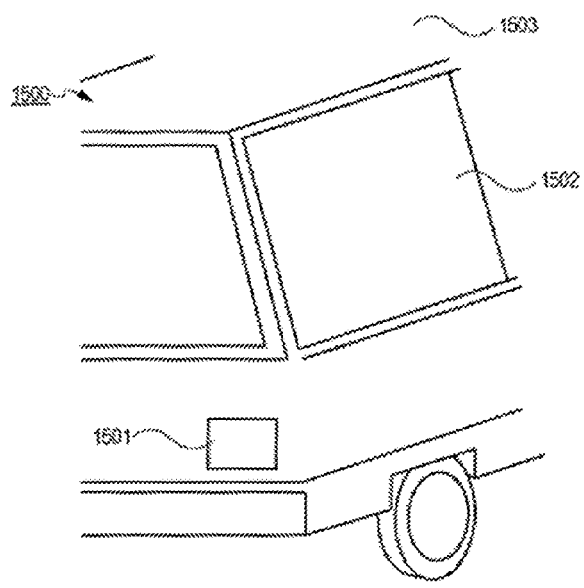

FIG. 12B is a schematic diagram that depicts an automobile 1500 that is example of a mobile object according to the present embodiment. The automobile 1500 may have a tail lamp 1501 that is an example of a lamp. The tail lamp 1501 illuminates in correspondence to, for example, a braking operation.

The tail lamp 1501 has a light-emitting device 10 according to the first or second embodiment. The tail lamp 1501 may have a protective member that protects the light-emitting device 10. The protective member has a certain degree of strength and any material can be used as long as the material is transparent, but the protective member is preferably composed of, for example, polycarbonate. A furandicarboxylic acid derivative, an acrylonitrile derivative, and so forth, may be mixed into the polycarbonate.

The automobile 1500 may have a vehicle body 1503 and a window 1502 attached to the vehicle body 1503. The window 1502 may be a transparent display and should not be a window for checking in front of and behind the automobile 1500. The transparent display may have the light-emitting device 10 according to the first or second embodiment. In this case, the constituent materials, e.g., the electrodes and so forth, of the light-emitting device 10 are composed of transparent members.

The mobile object according to the present embodiment may be, for example, a ship, aircraft, drone, and so forth. The mobile object may have an airframe and a lamp disposed on this airframe. The lamp may emit light in order to provide notification of the location of the airframe. The lamp has a light-emitting device 10 according to the first or second embodiment.

The display device according to the present embodiment (a display device that has a light-emitting device 10 according to the first or second embodiment and that carries out display using light emitted from the light-emitting device 10), for example, can also be applied to wearable devices such as smart glasses, HMDs, and smart contacts. The display device according to the present embodiment can also be applied to systems that have, e.g., a wearable device. Imaging display devices used as, for example, a wearable device, have an imaging device capable of the photoelectric conversion of visible light, and a display device capable of emitting visible light.

Figure 13A:
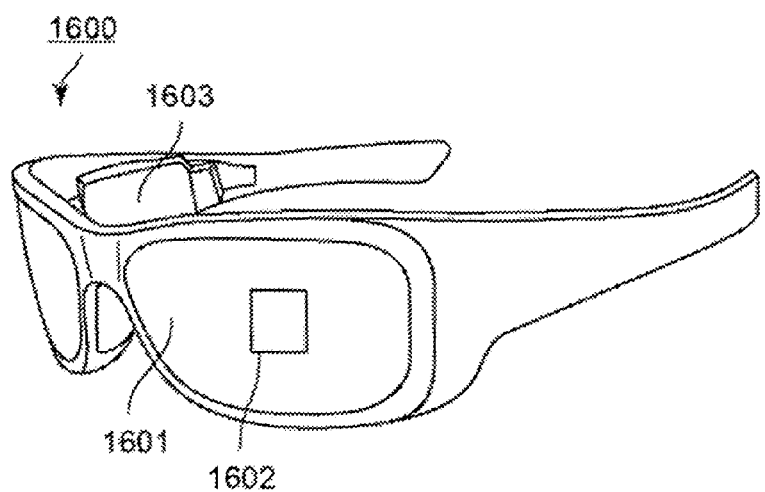
FIG. 13A and FIG. 13B are schematic diagrams that show a wearable device according to the third embodiment.

FIG. 13A is a schematic diagram that shows eyeglasses 1600 (smart glasses) that are an example of a wearable device according to the present embodiment. An imaging device 1602 such as a CMOS sensor or SPAD is provided on the front side of a lens 1601 of the eyeglasses 1600. In addition, a display device according to the present embodiment (a display device that has a light-emitting device 10 according to the first or second embodiment and that carries out display using light emitted from the light-emitting device 10) is provided on the back side of the lens 1601.

The eyeglasses 1600 are also provided with a control device 1603. The control device 1603 functions as a power source that supplies power to the imaging device 1602 and the display device. In addition, the control device 1603 controls the operation of the imaging device 1602 and the display device. An optical system for concentrating light on the imaging device 1602 is formed at the lens 1601.

Figure 13B:
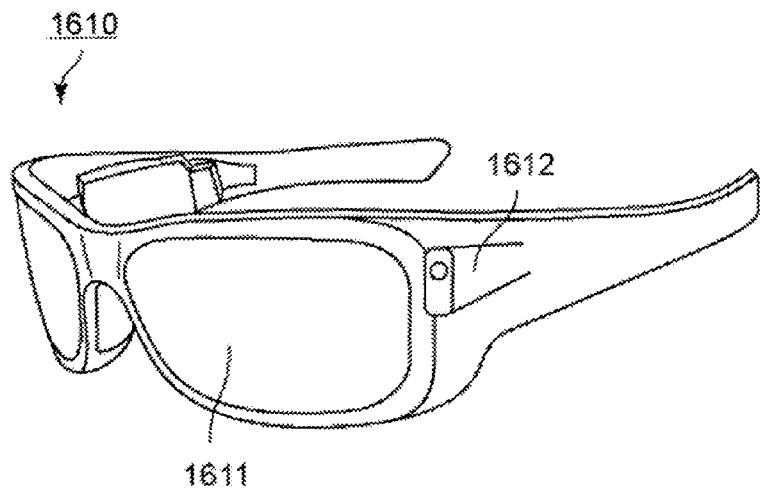

FIG. 13B is a schematic diagram that shows eyeglasses 1610 (smart glasses) that are an example of a wearable device according to the present embodiment. The eyeglasses 1610 have a control device 1612, and an imaging device corresponding to the imaging device 1602 and a display device according to the present embodiment are mounted in the control device 1612. At the lens 1611, an imaging device and an optical system for projecting light emitted from the display device are formed within the control device 1612 and an image is projected on the lens 1611. The control device 1612 functions as a power source that supplies power to the imaging device and display device and also controls the operation of the imaging device and display device.

The control device may have a line-of-sight detection unit that detects the line of sight of the wearer of the eyeglasses 1610. Infrared radiation may be used to detect the line of sight. An infrared-emitting unit emits infrared radiation toward the eyeball of the user, who is observing a displayed image. A captured image of the eyeball is obtained by the detection, by an imaging unit that has a light-receiving element, of the emitted infrared light that has undergone reflection from the eyeball. The decline in the quality of the image projected from the display device on the lens 1611 is reduced by the presence of a reducing unit that reduces the light from the infrared-emitting unit toward the display unit in plan view. The user's line of sight to the displayed image is detected from the captured image of the eyeball obtained by the infrared imaging. Any known method can be used for the line-of-sight detection using the captured image of the eyeball. For example, a line-of-sight detection method based on a Purkinje image provided by the reflection of irradiated light by the cornea can be used. More specifically, a line-of-sight detection process based on the pupil-corneal reflex method is performed. Using the pupil-corneal reflex method, the user's line of sight is detected by calculating—based on the Purkinje image and the image of the pupil contained in the captured image of the eyeball—the line-of-sight vector representing the direction of the eyeball (rotation angle).

When display control is carried out based on visual detection (line-of-sight detection), the light-emitting device 10 according to the first or second embodiment can preferably be applied to smart glasses that have an imaging device that images the outside. Smart glasses can display captured external information in real time.

The display device according to the present embodiment (a display device that has a light-emitting device 10 according to the first or second embodiment and that carries out display using light emitted from the light-emitting device 10) may have an imaging device that has a light-receiving element, and may control the displayed image based on the user's line-of-sight information from the imaging device. Specifically, a first visual field region that the user observes and a second visual field region other than the first visual field region are determined based on the line-of-sight information. The first visual field region and the second visual field region may be determined by a control device of the display device, or those determined by an external control device may be received by the display device. In the display region of the display device, the display resolution of the first visual field region may be controlled to be higher than the display resolution of the second visual field region. That is, the resolution of the second visual field region may be lower than that of the first visual field region.

In addition, the display region may have a first display region and a second display region different from the first display region, and the higher priority region of the first display region and the second display region may be determined based on line-of-sight information. The first display region and the second display region may be determined by a control device of the display device, or those determined by an external control device may be received by the display device. The resolution of the higher priority region may be controlled to be higher than the resolution of a region other than the higher priority region. That is, the resolution of the region having a relatively lower priority may be lower.

AI may be used to determine, for example, the first visual field region, the higher priority region, and so forth. The AI may be a model configured to estimate—from the image of the eyeball—the angle of the line of sight and the distance to a target object ahead in the line of sight, using as teaching data the eyeball image and the direction that the eyeball in said image actually viewed. The AI program may be resident at the display device, the imaging device, or an external device. If it is resident on an external device, it is transmitted to the display device via communication.

As has been described in the preceding, the use for various devices of a light-emitting device 10 according to the first or second embodiment makes it possible to carry out display at high quality levels and to perform excellent light emission.

EXAMPLES

Examples of the present invention are described in the following.

Example 1

An organic EL device having the structure given by FIG. 1 was fabricated as follows.

Al and Ti were first formed on a substrate 1 by a sputtering method, and this was patterned to form wiring 21. SiO was then formed by a CVD method and a plug 11 was formed by etching. An Al:Cu alloy was then formed by a sputtering method, and a laminated film of Al:Cu alloy and TiN was formed by additionally forming TiN by a sputtering method. The Al:Cu alloy is an example of a first material, and the layer of the Al:Cu alloy corresponds to a high-reflection layer. Similarly, the TiN is an example of a second material, and the TiN layer corresponds to a low-reflection layer. The shape of the peripheral laminated section 404 for the first laminated section 104 of the first organic EL element, the second laminated section 204 of the second organic EL element, and the third laminated section 304 of the third organic EL element was formed by etching the Al:Cu alloy and TiN. The TiN of the first laminated section 104 was removed by partial etching to obtain an opening in which the Al:Cu alloy was exposed.

SiO was then formed by a CVD method as an optical interference layer 31, and the optical interference layer 31 and the TiN in the second laminated section 204 were removed in the same process by etching to obtain an opening in the second laminated section 204 in which the Al:Cu alloy was exposed. SiO was subsequently formed by a CVD method as an optical interference layer 32, and the optical interference layer 32 and the TiN of the third laminated section 304 were removed in the same process by etching to obtain an opening in the third laminated section 304 in which the Al:Cu alloy was exposed. This was followed by the formation of SiO by a CVD method as an optical interference layer 33.

The respective desired optical distances were obtained by generating different film thicknesses for the optical interference layer 30 in each of the first organic EL element, the second organic EL element, and the third organic EL element. The TiN of the first laminated section 104, the second laminated section 204, and the third laminated section 304 was subsequently exposed by forming a plug 12 in the optical interference layer 30.

An ITO film was then formed by a sputtering method, and the lower electrode 2 of the first organic EL element, the second organic EL element, and the third organic EL element was formed by etching. A film of SiO for the insulating layer 5 was subsequently formed by a CVD method over the lower electrode 2. An opening region was established in the insulating layer 5 for each light-emitting element to provide the first light-emitting region 101, the second light-emitting region 201, and the third light-emitting region 301. The first light-emitting region 101, the second light-emitting region 201, and the third light-emitting region 301 were confirmed to overlay in plan view the opening where the Al:Cu alloy was exposed, for the first laminated section 104, the second laminated section 204, and the third laminated section 304, respectively.

The organic compound layer 3 was then formed on the lower electrode 2. Specifically, the compound 1 indicated below was formed in a thickness of 3 nm as a hole injection layer. This was followed by the formation of the compound 2 indicated below in a thickness of 15 nm as a hole transport layer and the formation of the compound 3 indicated below in a thickness of 10 nm as an electron blocking layer.

A first light-emitting layer was formed in a thickness of 10 nm, by providing 97% as the weight ratio of the compound 4 indicated below as host material and 3% as the weight ratio of the compound 5 indicated below as the light-emitting dopant. A second light-emitting layer was formed in a thickness of 10 nm, by providing 98% as the weight ratio of the compound 4 indicated below as host material and 1% as the weight ratio of each of the compound 6 indicated below and the compound 7 indicated below as light-emitting dopants. The compound 8 indicated below was formed in a thickness of 110 nm as an electron transport layer. Lithium fluoride was formed in a thickness of 1 nm as an electron injection layer.

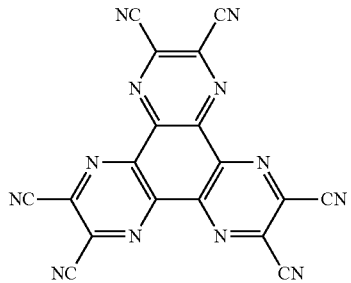

COMPOUND 1

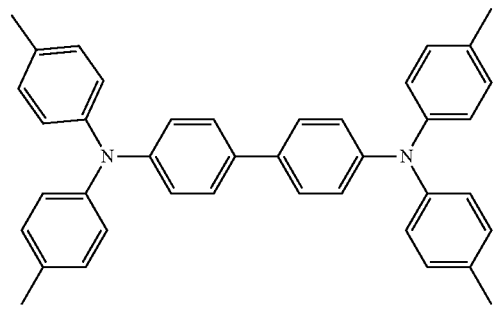

COMPOUND 2

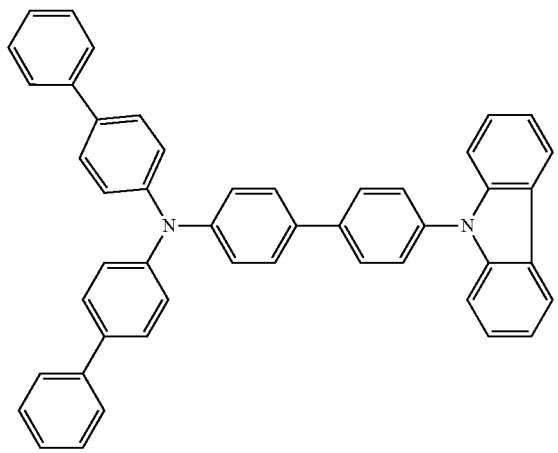

COMPOUND 3

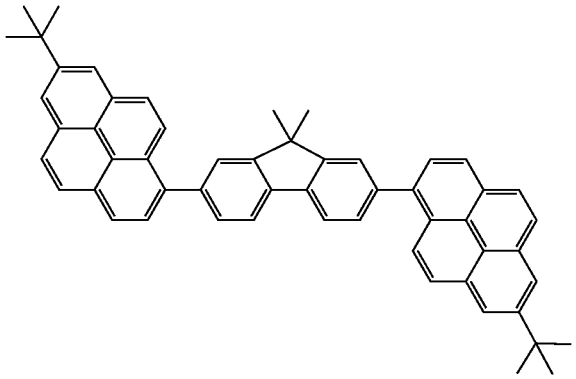

COMPOUND 4

-continued

COMPOUND 5

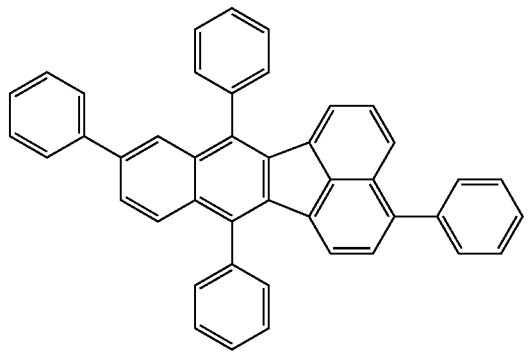

COMPOUND 6

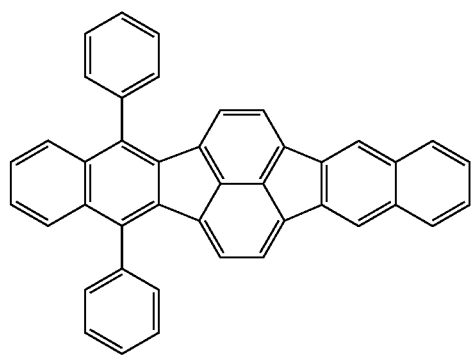

COMPOUND 7

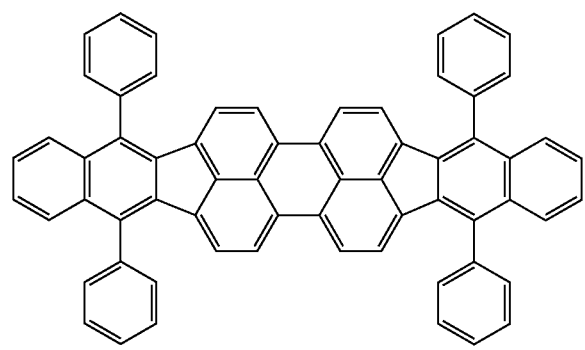

COMPOUND 8

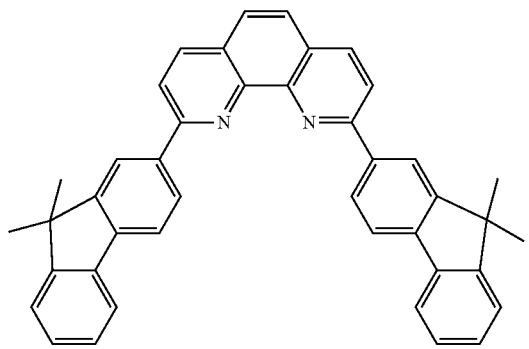

An MgAg alloy was then formed in a thickness of 10 nm as the upper electrode 4. The ratio between the Mg and Ag was 1:1. This was followed by the formation of an SiN film by a CVD method in a thickness of 2 μm to provide the protection layer 6. A planarized layer 7 was formed in a thickness of 300 nm by spin coating on the SiN film.

Color filters were then formed on the planarized layer 7. The first color filter 121 was a color filter that transmitted the red component, the second color filter 221 was a color filter that transmitted the green component, and the third color filter 321 was a color filter that transmitted the blue component. A planarized layer 8 was then formed over the individual color filters. This was followed by the formation of a lens 122 on the first color filter 121, the formation of a lens 222 on the second color filter 221, and the formation of a lens 322 on the third color filter 321.

Comparative Example 1

Fabrication was carried out as in Example 1, except for the formation processes for the optical interference layers and the peripheral laminated section 404 for the first laminated section 104 of the first organic EL element, the second laminated section 204 of the second organic EL element, and the third laminated section 304 of the third organic EL element. The differences from Example 1 will be described.

After formation of the plug 11, TiN was formed by a sputtering method and Al:Cu alloy was formed by a sputtering method to form a laminated film of TiN and Al:Cu alloy. The shape of the peripheral laminated section 404 for the first laminated section 104 of the first organic EL element, the second laminated section 204 of the second organic EL element, and the third laminated section 304 of the third organic EL element was formed by etching the TiN and Al:Cu alloy.

SiO was then formed by a CVD method as the optical interference layer 31, and the optical interference layer 31 over the first laminated section 104 was removed by etching. SiO was subsequently formed by a CVD method as the optical interference layer 32, and the optical interference layer 32 over the second laminated section 204 was removed. SiO was thereafter formed by a CVD method as the optical interference layer 33.

The respective desired optical distances were obtained by generating different film thicknesses for the optical interference layer 30 in each of the first organic EL element, the second organic EL element, and the third organic EL element. Example 1 was then followed from the plug 12 step onward.

Comparison of Example 1 and Comparative Example 1

The influence of external light reflection was evaluated for the organic EL devices of Example 1 and Comparative Example 1. The evaluation was performed in bright light where external light was incident on the organic EL device. In Comparative Example 1, there was strong external light reflection at the display region 50 and the peripheral region 400 and reflected glare and coloration were confirmed. With Example 1, on the other hand, it could be confirmed that reflected glare and coloration in the display region 50 and the peripheral region 400 were suppressed in comparison to Comparative Example 1, and a suppressing effect on external light reflection could thus be confirmed for the organic EL device structure of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The present invention can provide a light-emitting device in which a suppression of external light reflection can coexist with a high luminous efficacy.

What is claimed is:

1. A light-emitting device comprising:
    a substrate;
    a first light-emitting element including a lower electrode that is transparent in visible light, a light emitting layer, and an upper electrode in this order from the substrate;
    a first laminated section disposed between the substrate and the first light-emitting element and including a first metal layer and a second metal layer in this order from the substrate;
    a first peripheral laminated section and a second peripheral laminated section comprising a third metal layer and a fourth metal layer in this order from the substrate,
    wherein the first laminated section is disposed between the first peripheral laminated section and the second peripheral laminated section in a cross-section perpendicular to the substrate,
    wherein the first metal layer includes a first metal, the second metal layer includes a second metal different from the first metal, the third metal layer includes the first metal, and the fourth metal layer includes the second metal, and
    wherein the first laminated section at a portion overlapping the light emitting layer in a plan view has an opening such that the first metal layer is exposed.

2. The light-emitting device according to claim 1, wherein the first metal layer and the third metal layer consist essentially of a material having a same main component, and
    wherein the second metal layer and the fourth metal layer consist essentially of a material having a same main component.

3. The light-emitting device according to claim 1, wherein a reflectance of the first metal layer is higher than a reflectance of the second metal layer, and
    wherein a reflectance of the third metal layer is higher than a reflectance of the fourth metal layer.

4. The light-emitting device according to claim 3, wherein a difference between the reflectance of the first metal layer and the reflectance of the second metal layer is at least 10 percentage points.

5. The light-emitting device according to claim 1, wherein the first metal is a material comprising Al as a main component, and
    wherein the second metal is a material comprising Ti or TiN as a main component.

6. The light-emitting device according to claim 5, wherein a thickness of the second metal layer is 1 nm to 200 nm.

7. The light-emitting device according to claim 1, wherein the lower electrode of the first light-emitting element is in contact with the first metal layer via the second metal layer of the first laminated section interposed therebetween.

8. The light-emitting device according to claim 1, further comprising:
    an optical interference layer between the first laminated section and the lower electrode of the first light-emitting element,
    wherein the lower electrode of the first light-emitting element and the second metal layer of the first laminated section are electrically connected through a conductive material within a plug that penetrates the optical interference layer.

9. The light-emitting device according to claim 1, further comprising:
    an optical interference layer between the first laminated section and the lower electrode of the first light-emitting element,
    wherein the optical interference layer is in contact with the first metal layer in the opening of the first laminated section.

10. The light-emitting device according to claim 1, wherein a distance between the first laminated section and the substrate is approximately the same as the distance between the second peripheral laminated section and the substrate.

11. The light-emitting device according to claim 1, wherein a portion of the fourth metal layer overlaps with a portion of the upper electrode in a plan view, and
    wherein a portion of the fourth metal layer is separated from a portion of the upper electrode in cross-sectional view.

12. The light-emitting device according to claim 1, wherein the first metal layer of the first laminated section is in contact with wiring that connects to an external power source, and
    wherein a contact point between the wiring and the first metal layer does not overlap with the opening of the first laminated section in orthographic projection with respect to the substrate.

13. The light-emitting device according to claim 1, wherein the fourth metal layer of the second peripheral laminated section is electrically connected to the upper electrode.

14. The light-emitting device according to claim 1, wherein the second peripheral laminated section contains a moisture proof region, and
    wherein the fourth metal layer in the moisture proof region does not have an opening.

15. The light-emitting device according to claim 14, wherein a protection layer that extends to the second peripheral laminated section is disposed on the side of the upper electrode opposite from the substrate,
    wherein a contact section, which comprises a material that has a same main component as the lower electrode, is continuously disposed in the moisture proof region,
    wherein at least a portion of the second peripheral laminated section and at least a portion of the contact section overlap in a plan view, and
    wherein the contact section is in direct contact with the protection layer.

16. The light-emitting device according to claim 1, wherein the first light-emitting element is an organic EL element that comprises an organic light-emitting material in the light emitting layer.

17. A display device comprising:
    a display portion that has the light-emitting device according to claim 1; and
    a control circuit that controls the display portion.

18. An imaging device comprising:
    an optical portion;
    an imaging element that receives light that has passed through the optical portion; and
    a display portion that displays an image that the imaging element has acquired,
    wherein the display portion has the light-emitting device according to claim 1.

19. An electronic device comprising:
a display portion having the light-emitting device according to claim 1;
a housing in which the display portion is disposed; and
a communication portion that is disposed in the housing and communicates with the outside.

\* \* \* \* \*